United States Patent
Sako et al.

(10) Patent No.: US 8,238,154 B2
(45) Date of Patent: Aug. 7, 2012

(54) NONVOLATILE SEMICONDUCTOR MEMORY WITH CHARGE STORAGE LAYERS AND CONTROL GATES

(75) Inventors: Mario Sako, Yokohama (JP); Jun Fujimoto, Kamakura (JP); Noriyasu Kumazaki, Kawasaki (JP); Yasuhiko Honda, Hiratsuka (JP); Yoshihiko Kamata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 12/552,563

(22) Filed: Sep. 2, 2009

(65) Prior Publication Data
US 2010/0214837 A1    Aug. 26, 2010

(30) Foreign Application Priority Data

Feb. 26, 2009   (JP) ................. 2009-044003

(51) Int. Cl.
*G11C 16/04* (2006.01)
(52) U.S. Cl. ............. 365/185.03; 365/226; 365/227; 365/229; 365/185.18; 365/185.25
(58) Field of Classification Search .......... 365/148, 365/185.03, 185.17, 185.25, 185.26, 185.18, 365/226, 227, 229
See application file for complete search history.

(56) References Cited

U.S. PATENT DOCUMENTS

| | | | |
|---|---|---|---|
| 5,337,282 A * | 8/1994 | Koike | 365/222 |
| 6,829,194 B2 * | 12/2004 | Honda et al. | 365/226 |
| 6,865,125 B2 * | 3/2005 | Tanzawa et al. | 365/200 |
| 7,352,637 B2 * | 4/2008 | Honda | 365/189.09 |
| 2005/0276110 A1 * | 12/2005 | Sakurai et al. | 365/185.18 |
| 2006/0198191 A1 * | 9/2006 | Nakai | 365/185.13 |

FOREIGN PATENT DOCUMENTS

JP    2000-149566    5/2000

* cited by examiner

*Primary Examiner* — Pho M Luu
*Assistant Examiner* — Thao Bui
(74) *Attorney, Agent, or Firm* — Oblon, Spivak, McClelland, Maier & Neustadt, L.L.P.

(57) ABSTRACT

A nonvolatile semiconductor memory includes a memory cell array, bit lines, a first voltage generator, and a second voltage generator. The memory cell array includes memory cells. The bit lines each of which is connected electrically to one end of the current path of the corresponding one of the memory cells. The first voltage generator which is capable of supplying via a first output terminal to the bit lines a first voltage externally supplied or a third voltage which is obtained by stepping down a second voltage supplied and higher than the first voltage and which is as high as the first voltage. The second voltage generator which is capable of supplying a fourth voltage obtained by stepping down the second voltage to the bit lines via a second output terminal when the first voltage generator steps down the second voltage to generate the third voltage.

20 Claims, 11 Drawing Sheets

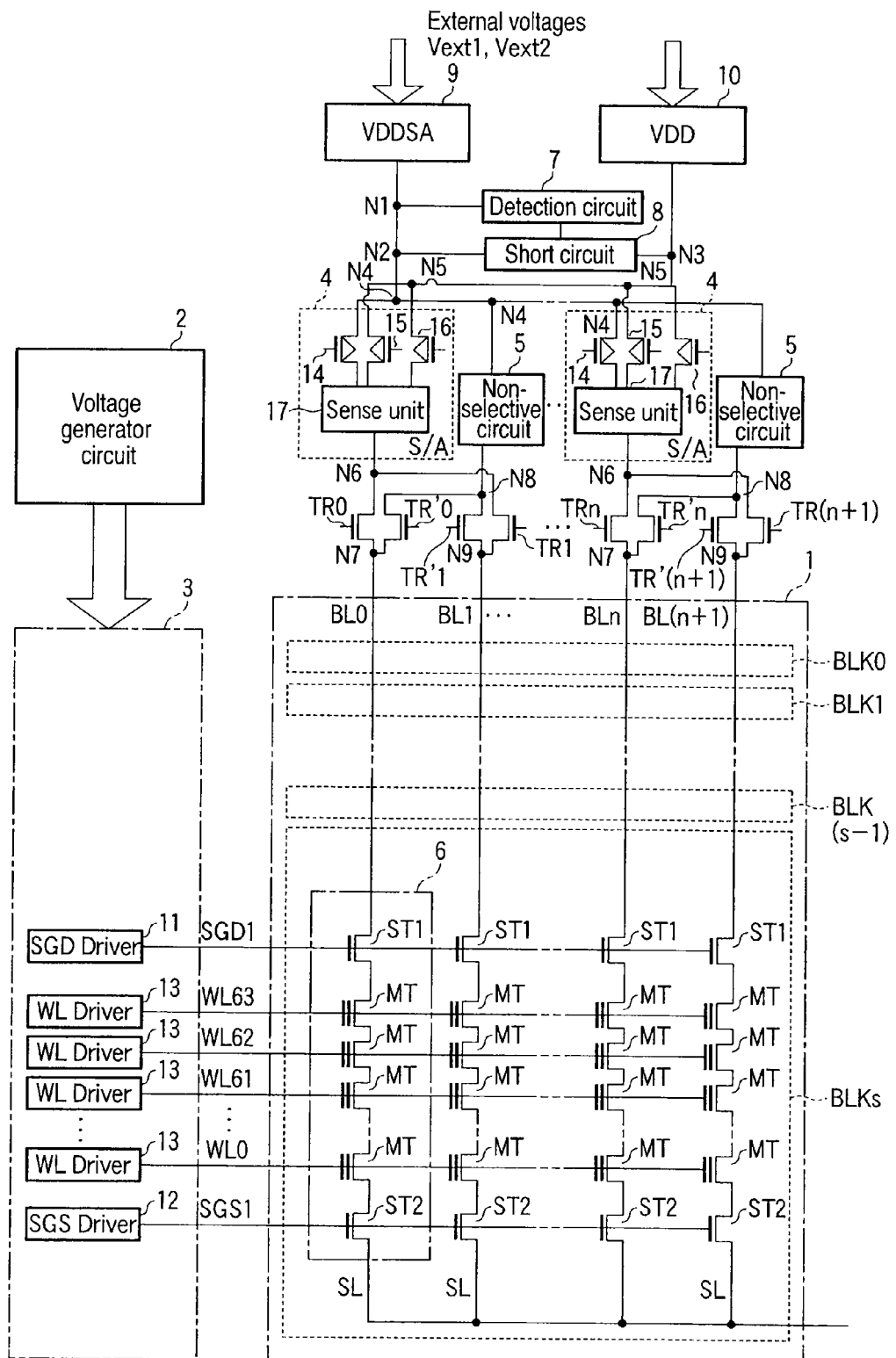
F I G. 1

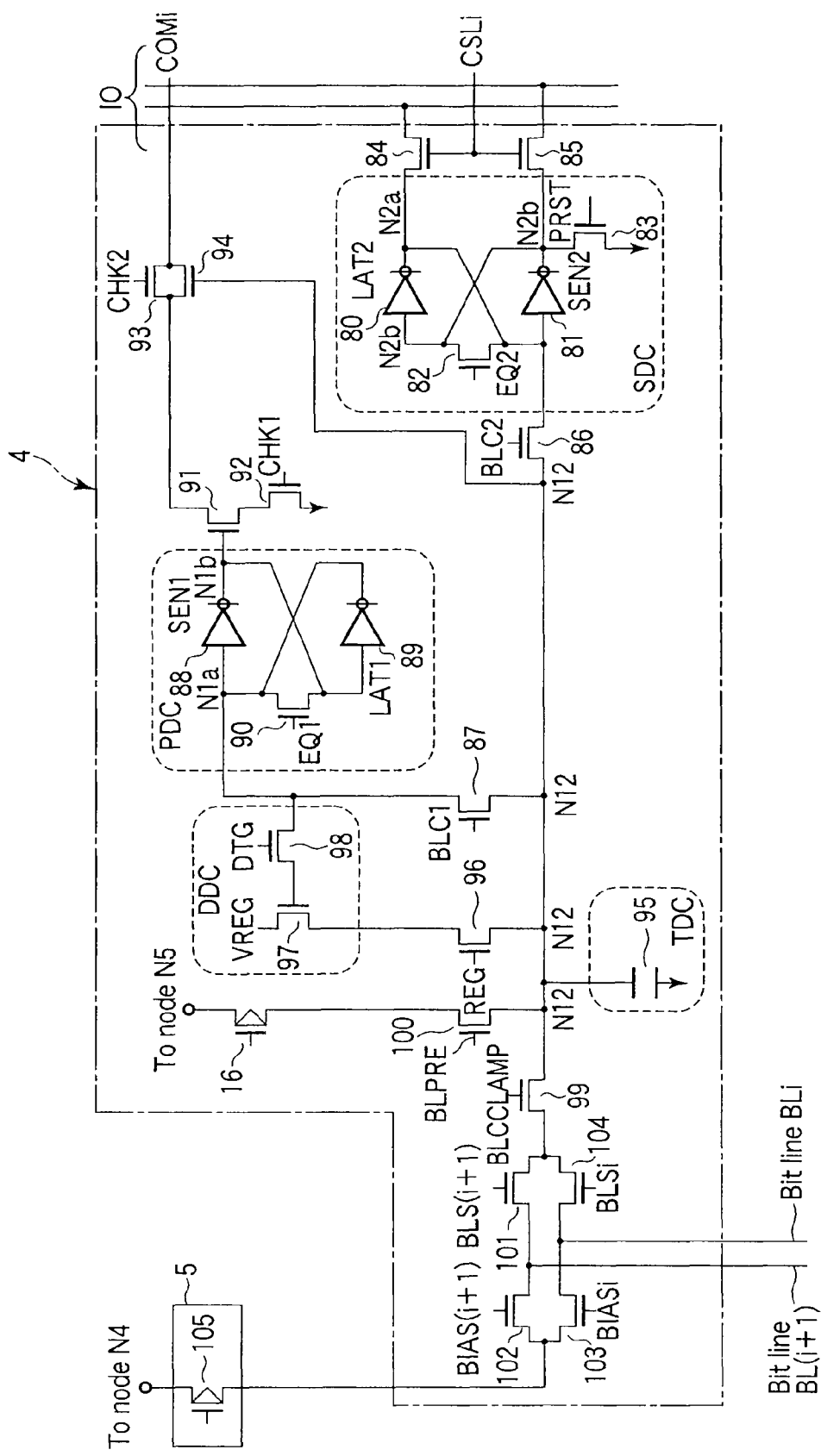
F I G. 3

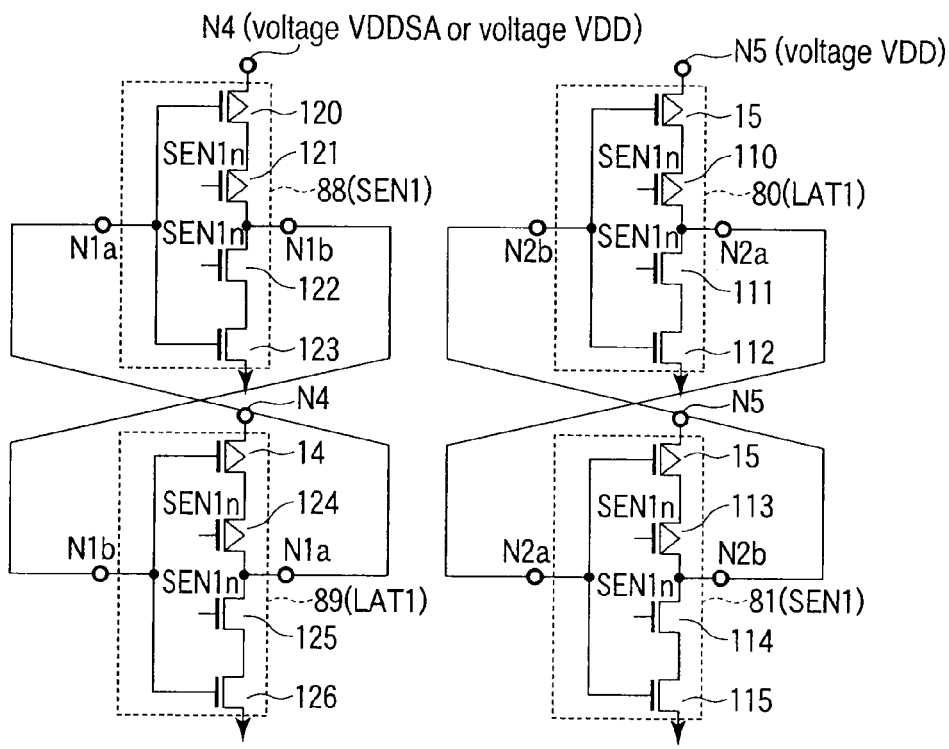
F I G. 4
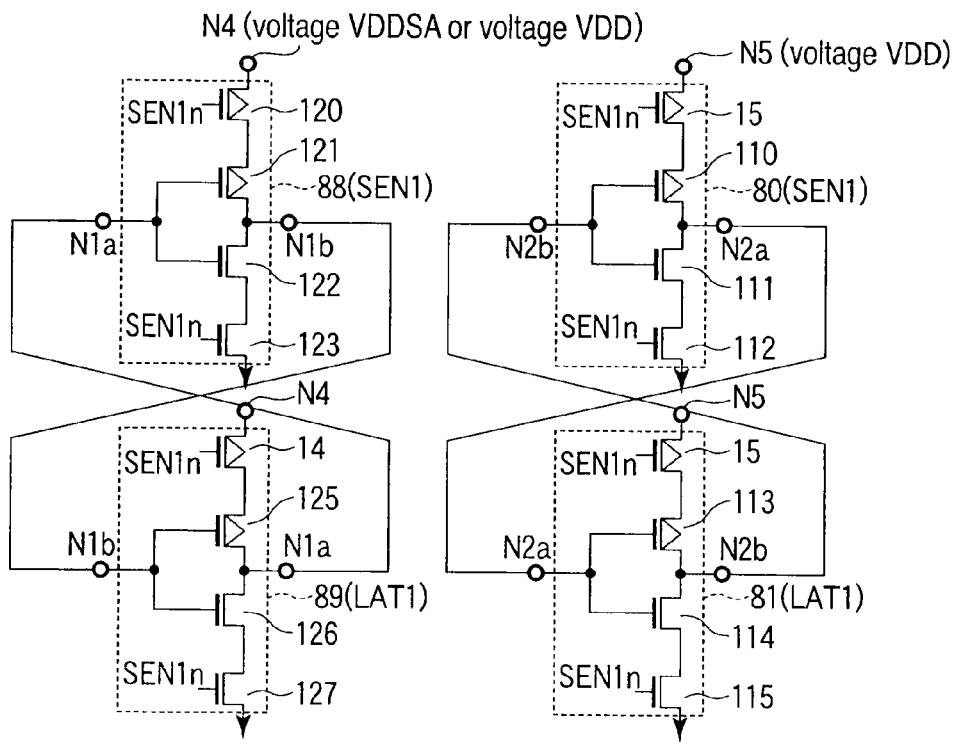
F I G. 5

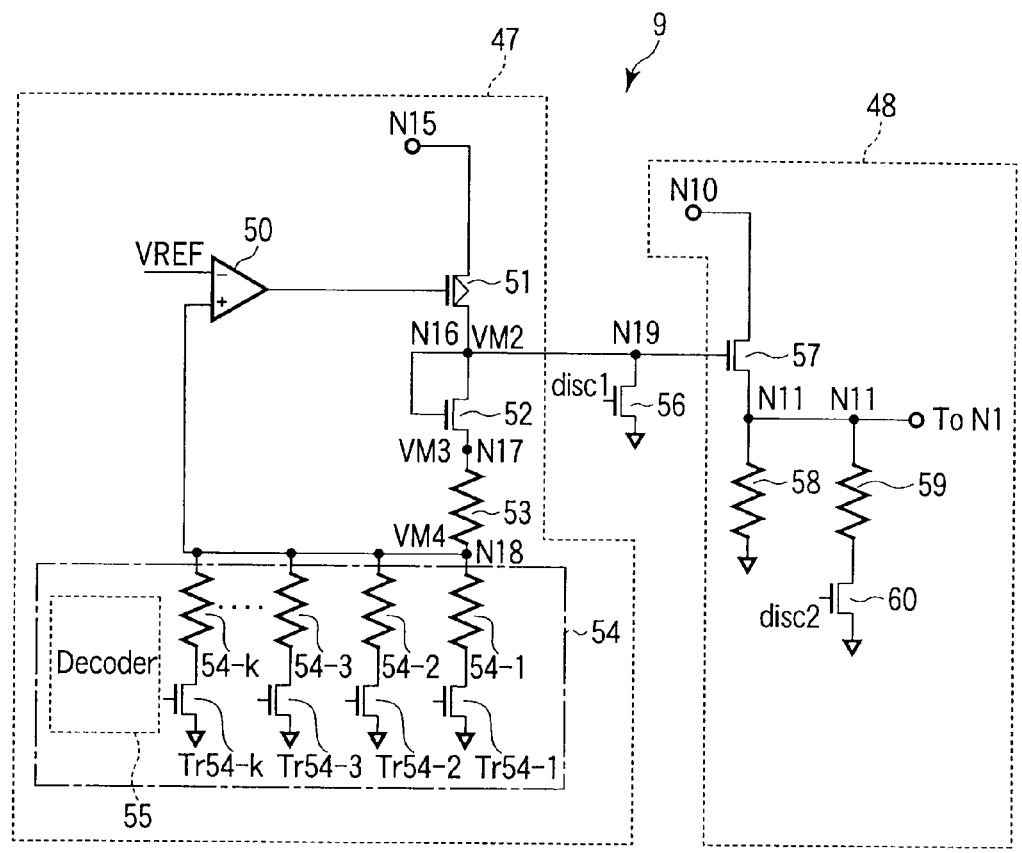
F I G. 8
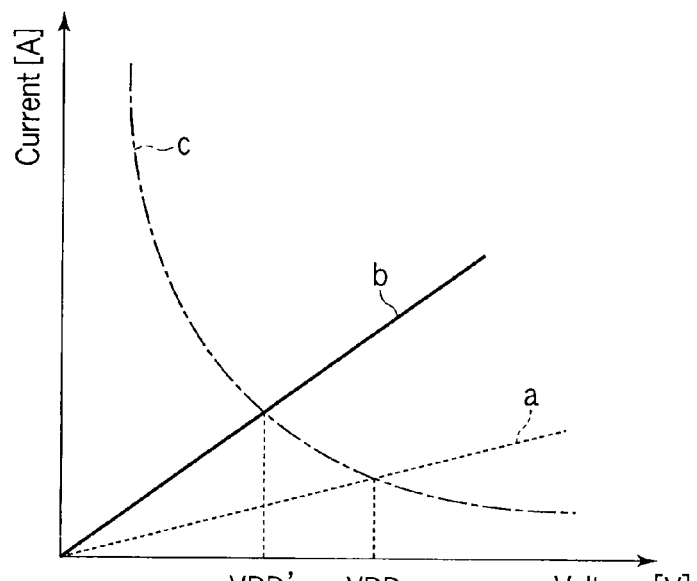
F I G. 9

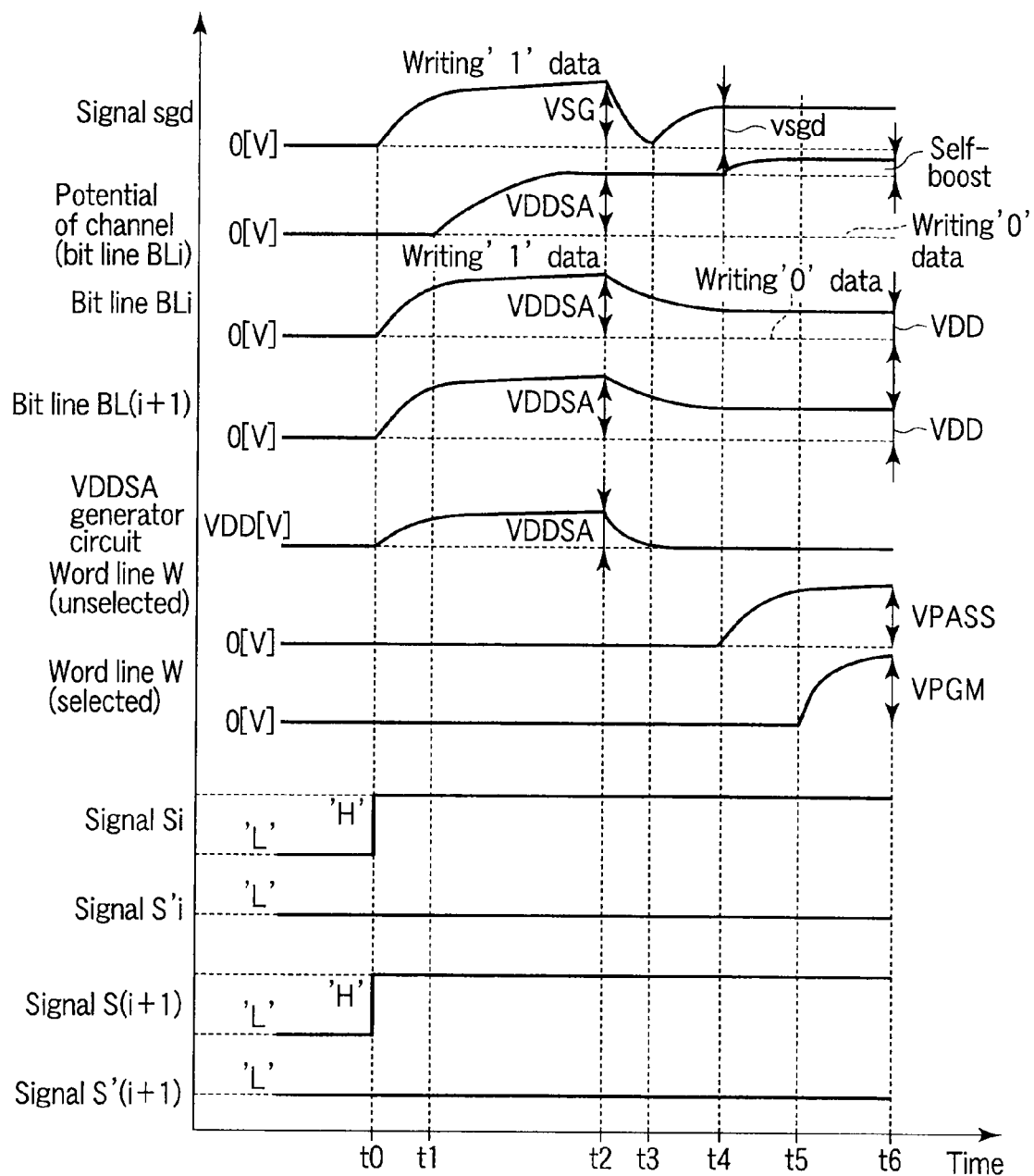
F I G. 10

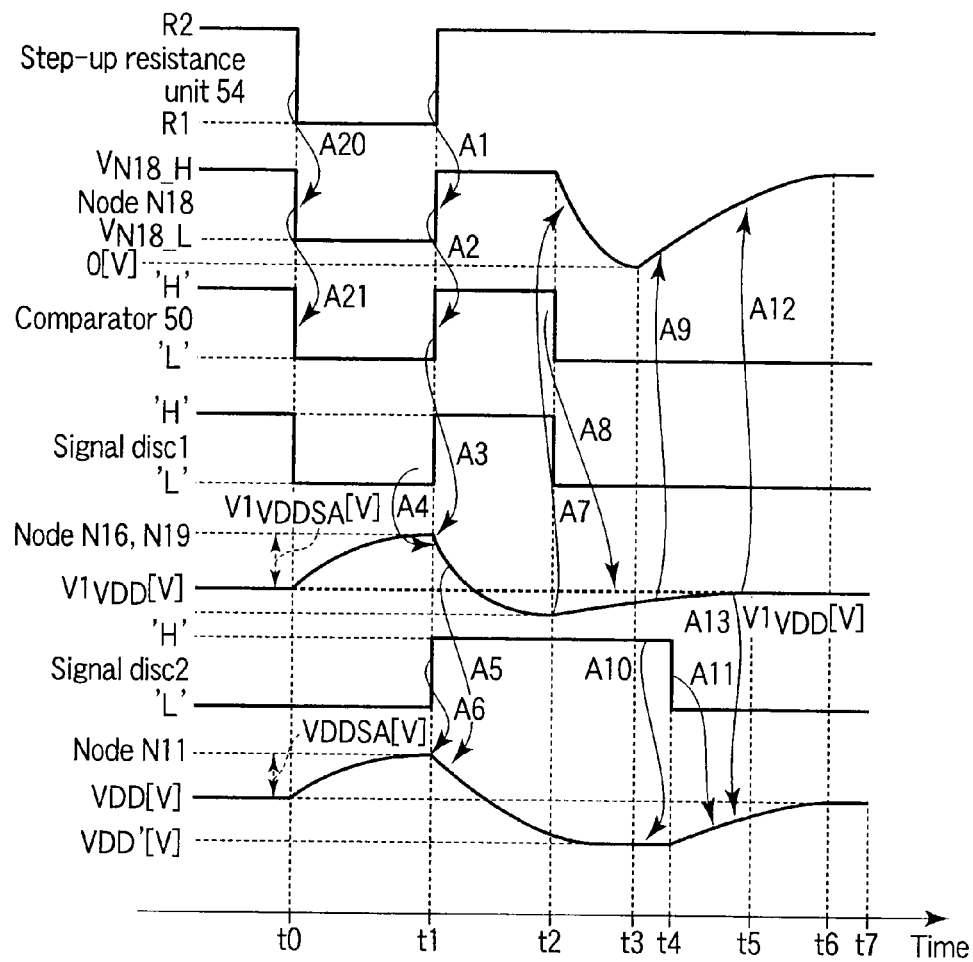
F I G. 12
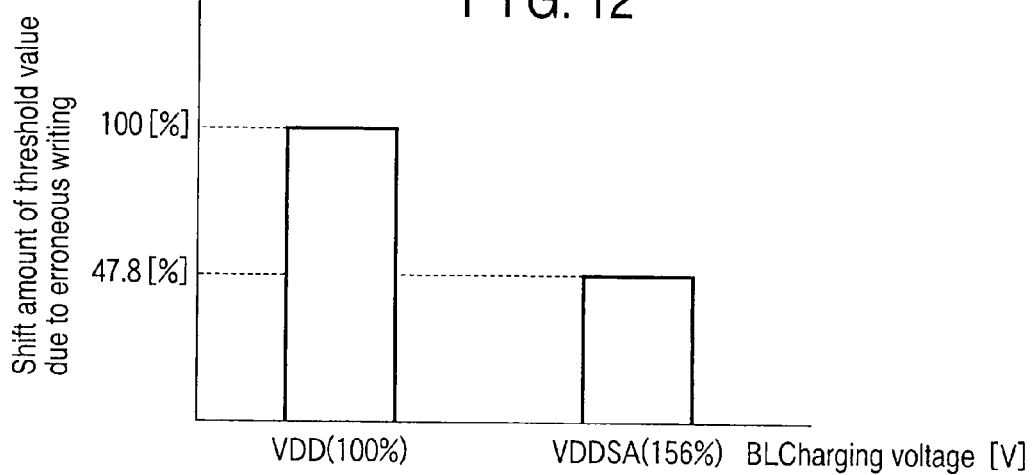
F I G. 13

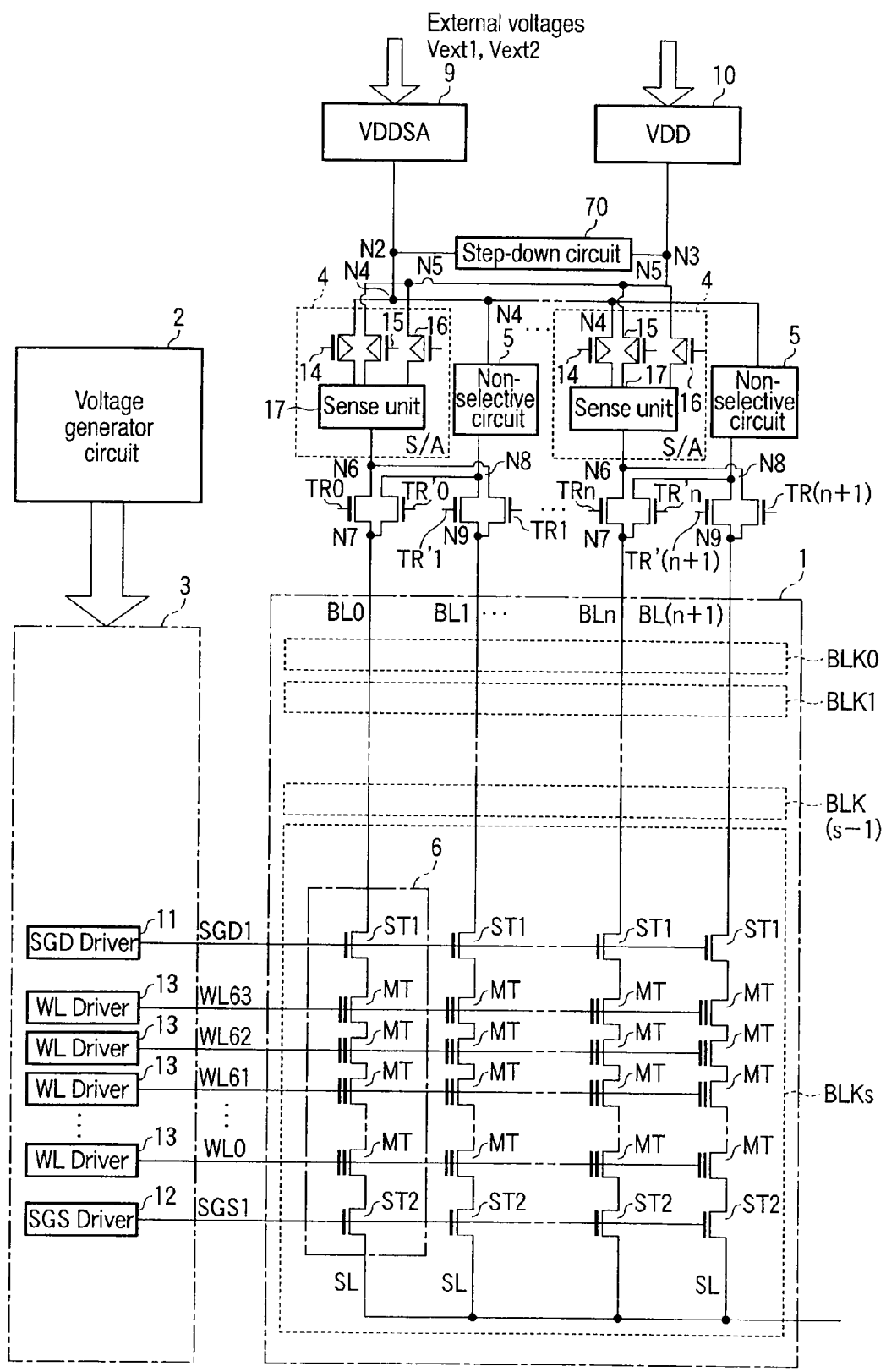
F I G. 16

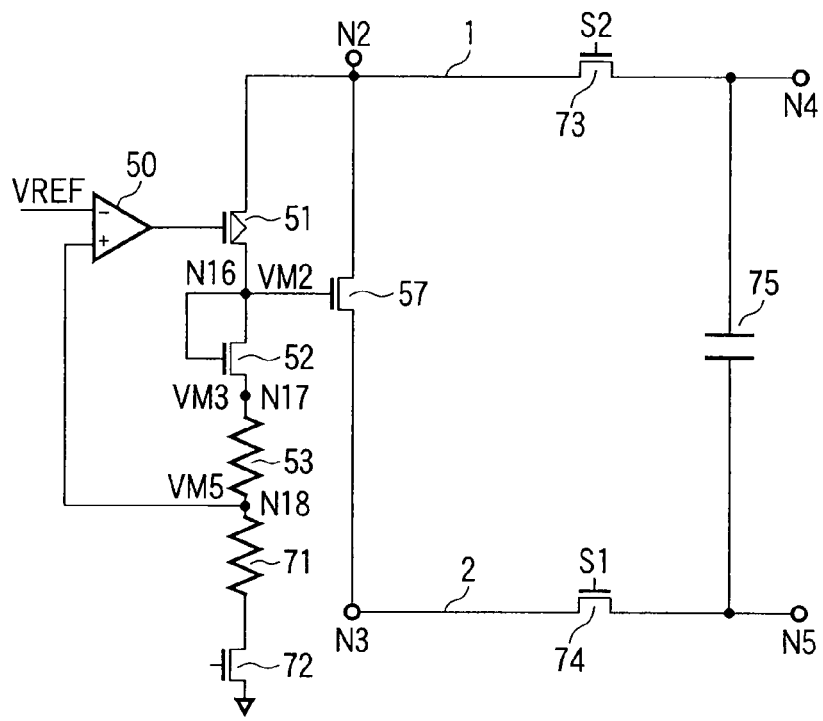
F I G. 17
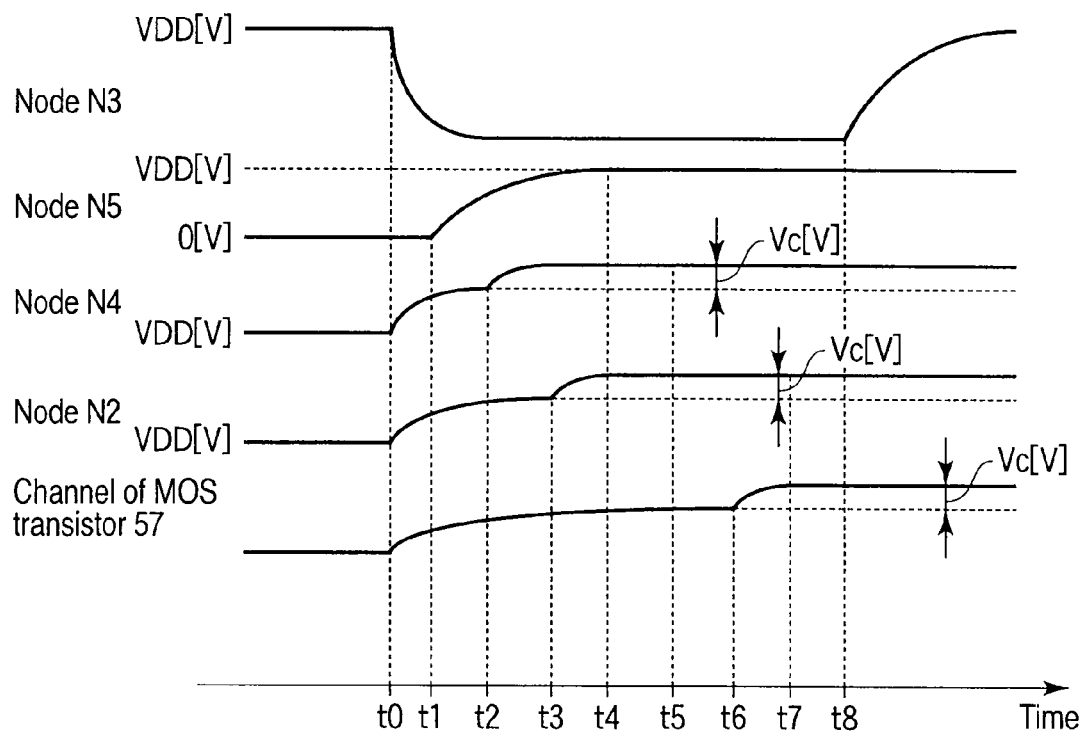
F I G. 18

NONVOLATILE SEMICONDUCTOR MEMORY WITH CHARGE STORAGE LAYERS AND CONTROL GATES

CROSS-REFERENCE TO RELATED APPLICATIONS

This application is based upon and claims the benefit of priority from prior Japanese Patent Application No. 2009-044003, filed Feb. 26, 2009, the entire contents of which are incorporated herein by reference.

BACKGROUND OF THE INVENTION

1. Field of the Invention

This invention relates to a nonvolatile semiconductor memory.

2. Description of the Related Art

To write "0" data into a NAND flash memory, it is necessary to make a sufficient potential difference between a channel formed between the source and drain and a control gate and inject charges into a charge storage layer.

To write "1" data, however, a specific potential is applied to the channel in advance to prevent a potential difference from being made between the control gate and channel, thereby preventing charges from being injected into the charge storage layer.

Actually, even in a memory cell into which "1" data is to be written, there is a potential difference between the control gate and channel, allowing a small number of charges to be injected into the charge storage layer (hereinafter, this phenomenon is referred to as program disturbance). Jpn. Pat. Appln. KOKAI Publication No. 2000-149566 has disclosed the problem of deterioration in the operational reliability of a NAND flash memory.

BRIEF SUMMARY OF THE INVENTION

A nonvolatile semiconductor memory according to an aspect of the invention include, a memory cell array which includes a plurality of memory cells, each including a charge storage layer and a control gate, being capable of holding not less than two levels of data, and having its current paths connected in series;

bit lines each of which is connected electrically to one end of the current path of the corresponding one of the memory cells;

a first voltage generator unit which is capable of supplying via a first output terminal to the bit lines a first voltage externally supplied or a third voltage which is obtained by stepping down a second voltage externally supplied and higher than the first voltage and which is as high as the first voltage; and a second voltage generator unit which is capable of supplying a fourth voltage obtained by stepping down the second voltage to the bit lines via a second output terminal when the first voltage generator unit steps down the second voltage to generate the third voltage.

BRIEF DESCRIPTION OF THE SEVERAL VIEWS OF THE DRAWING

FIG. 1 is a block diagram of a nonvolatile semiconductor memory according to an embodiment of the invention;

FIG. 3 is a circuit diagram of a sense amplifier according to the embodiment;

FIG. 4 and FIG. 5 are a circuit diagram of a clocked inverter according to the embodiment;

FIG. 8 is a circuit diagram of a VDDSA generator circuit according to the embodiment;

FIG. 9 shows an I-V characteristic of a second voltage generator circuit according to the embodiment;

FIG. 10 is a timing chart to explain a write operation of a nonvolatile semiconductor memory according to the embodiment, showing signal sgd, the selected bit line BL and its channel, an unselected bit line BL, the VDDSA generator circuit, the selected word line WL, an unselected word line WL, signal Si, signal S'i, signal S(i+1), and signal S'(i+1);

FIG. 12 is a timing chart to explain a voltage transfer operation of the nonvolatile semiconductor memory according to the embodiment, showing a step-up resistance unit, node N18, a comparator, signal disc1, nodes N16, N19, signal disc2, and node N11;

FIG. 13 shows a threshold shift amount of the nonvolatile semiconductor memory according to the embodiment;

FIG. 16 is a block diagram of a nonvolatile semiconductor memory according to the modification of the embodiment;

FIG. 17 is a circuit diagram of a step-down circuit according to the modification of the embodiment; and FIG. 18 is a timing chart to explain a voltage transfer operation according to the modification of the embodiment, showing nodes N2 to N5 and the channel of MOS transistor 57.

DETAILED DESCRIPTION OF THE INVENTION

Figure 2:
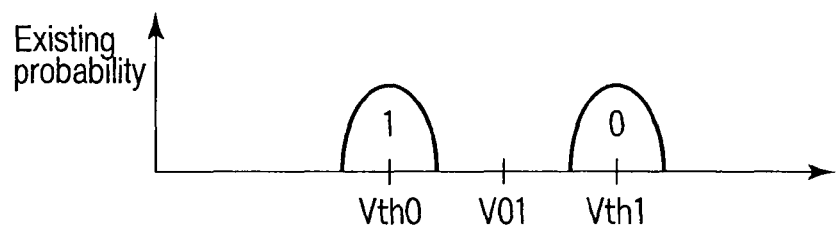
FIG. 2 shows a threshold distribution of a memory cell transistor according to the embodiment.

Hereinafter, referring to the accompanying drawings, embodiments of the invention will be explained. In the explanation below, the same parts are indicated by the same reference numerals.

A nonvolatile semiconductor memory according to an embodiment of the invention will be explained with reference to FIG. 1. FIG. 1 is a block diagram of a NAND flash memory according to the embodiment. The NAND flash memory of the embodiment is configured to be capable of operating according to a plurality of external voltages. FIG. 1 shows an example of the NAND flash memory which can operate on either external voltage Vext1 or Vext2. External voltage Vext1 is, for example, 1.8 [V] (=VDD) and external voltage Vext2 is, for example, 3.0 [V], higher than external voltage Vext1.

As shown in FIG. 1, the NAND flash memory includes a memory cell array 1, a voltage generator circuit 2, a row decoder 3, a sense amplifier 4, a nonselective circuit 5, a detection circuit 7, a short circuit 8, a VDDSA generator circuit 9, a VDD generator circuit 10, n-channel MOS transistors TR0 to TR(n+1), and n-channel MOS transistors TR'0 to TR'(n+1). When there is no need to distinguish between n-channel MOS transistors TR0 to TR(n+1), they will simply be referred to as the MOS transistors TR. When there is no need to distinguish between n-channel MOS transistors TR'0 to TR'(n+1), they will simply be referred to as the MOS transistors TR'. First, the memory cell array 1 will be explained.

<Configuration of Memory Cell Array 1>

The memory cell array 1 includes a plurality of nonvolatile memory cell transistors MT capable of holding data. Each of the memory cell transistors MT is an n-channel MOS transistor with a stacked gate that includes, for example, a charge storage layer and a control gate. The control gate of the memory cell transistor MT functions as a word line. The drain and source of the memory cell transistor are connected electrically to a bit line and a source line, respectively. The memory cell array 1 further has blocks BLK0 to BLKs (s is a natural number) each including a plurality of nonvolatile memory cell transistors MT.

As shown in FIG. 1, each of blocks BLK0 to BLKs includes a plurality of NAND strings 6 each composed of nonvolatile memory cell transistors MT connected in series. Each of the NAND strings 6 includes, for example, 64 memory cell transistors MT and select transistors ST1, ST2. Each of the memory cell transistors MT has a MONOS structure which includes a charge storage layer (e.g., an insulating film) formed via a gate insulating film above a semiconductor substrate, an insulating film (hereinafter, referred to as a block layer) which is formed on the charge storage layer and whose permittivity is higher than that of the charge storage layer, and a control gate formed on the block layer. The number of memory cell transistors MT is not limited to 64 and may be 128, 256, 512, or other suitable number. Adjacent memory cell transistors MT share their source and drain. The memory cell transistors MT are arranged in such a manner that their current paths are connected in series between select transistors ST1, ST2. The drain region on one end side of the series-connected memory cell transistors MT is connected to the source region of select transistor ST1. The source region on the other end side is connected to the drain region of select transistor ST2.

The control gate electrodes of the memory cell transistors MT in the same row are connected to any one of word line WL0 to word line WL63 in a common connection manner. The gate electrodes of select transistors ST1 of the memory cell transistors MT in the same row are connected to select gate line SGD1 in a common connection manner. The gate electrodes of select transistors ST2 of the memory cell transistors MT in the same row are connected to select gate line SGS1 in a common connection manner. To simplify the explanation, when there is no need to distinguish between word lines WL0 to WL63, they will simply be referred to as the word lines WL. In the memory cell array 1, the drains of select transistors ST1 in the same column are connected to any one of bit line BL0 to bit line BL(n+1) in a common connection manner. Hereinafter, when there is no need to distinguish between bit lines BL0 to BL(n+1) (n: an integer), they will simply be referred to as the bit lines BL. The sources of select transistors ST2 are connected to a source line SL in a common connection manner. Both of select transistors ST1 and ST2 are not necessarily needed. Only one of select transistors ST1 or ST2 may be used, provided that the NAND strings 6 can be selected. In the embodiment, suppose bit line BLn is even-numbered and bit line BL(n+1) is odd-numbered.

Data is written into a plurality of memory cell transistors MT connected to the same word line WL at the same time. This writing unit is called a page. Data is erased from a plurality of NAND strings 6 in blocks BLK at the same time.

<Threshold Distribution of Memory Cell Transistor MT>

A threshold distribution of the memory cell transistor MT will be explained with reference to FIG. 2. FIG. 2 is a graph where a threshold distribution is plotted along the abscissa axis and the existing probability of the memory cell transistors MT is plotted along the ordinate axis.

As shown in FIG. 2, each of the memory cell transistors MT is capable of holding 2-level data (or 1-bit data). That is, the memory cell transistor MT can hold two kinds of data, "1" and "0", in ascending order of threshold voltage Vth.

Threshold voltage Vth0 of "1" data in the memory cell transistor MT satisfies the expression Vth0<V01. Threshold voltage Vth1 of "0" data satisfies the expression V01<Vth1. In this way, the memory cell transistor MT can hold 1-bit data, including "0" data and "1" data, according to the threshold. The threshold voltage fluctuates as a result of charges being injected into the charge storage layer. The memory cell transistors MT may be configured to be capable of holding 4 or more levels of data.

<Voltage Generator Circuit 2>

Referring to FIG. 1, voltage generator circuit 2 will be explained. Voltage generator circuit 2 generates voltages necessary for a write operation, an erase operation, or a read operation and supplies the voltages to, for example, row decoder 3 in the NAND flash memory.

<Configuration of Row Decoder 3>

Row decoder 3 selects a row direction of the memory cell array 1 on the basis of the row address supplied from a control unit (not shown) in a write operation, a read operation, or an erase operation. That is, on the basis of the row address supplied from the control unit (not shown), row decoder 3 applies voltages to select gate lines SGD1, SGS1, and word lines WL0 to WL63.

As shown in FIG. 1, row decoder 3 includes select gate line drivers 11, 12 provided for select gate lines SGD1, SGS1 respectively, and word line drivers 13 provided for the word lines WL in a one-to-one correspondence. In the embodiment, only the word line drivers 13 and select gate line drivers 11, 12 corresponding to blocks BLKs are shown. Actually, however, the word line drivers 13 and select gate line drivers 11, 12 are connected to, for example, 64 word lines WL and select gate lines SGD1, SGS1, respectively, in a common connection manner.

When a block BLK has been selected according to the page address decoding result supplied from the control unit, the word line driver 13 transfers the necessary voltage supplied from the voltage generator circuit 2 to the control gate of the memory cell transistor MT via the selected word line WL.

When a block BLK has been selected according to the row address (or page address) decoding result supplied from the control unit, the select gate line driver 11 transfers the necessary voltage to the gate of select transistor ST1 via select gate line SGD1 corresponding to the block BLK. At this time, signal sgd is transferred to the gate of select transistor ST1. That is, when the memory cell transistor MT is written into, read from, erased from, or verified in data, select gate line driver 11 transfers, for example, signal sgd to the gate of select transistor ST1 via select gate line SGD1. Suppose the "L" level of signal sgd is at 0 [V] and the "H" level of signal sgd is at voltage VSG.

Like select gate line driver 11, select gate line driver 12, when the block BLK is selected, transfers the necessary voltage to the gate of select transistor ST2 via select gate line SGS1 in a write operation, a read operation, or a data verify operation of the memory cell transistor MT. At this time, signal sgs is transferred to the gate of select transistor ST2. Moreover, in an erase operation, 0 [V] is transferred to the gate of select transistor ST2 via select gate line SGS1. That is, suppose the "L" level of signal sgs is at 0 [V] and the "H" level of signal sgs is at voltage VSG.

<Sense Amplifier 4>

Next, the sense amplifier 4 will be explained. Sense amplifier 4 includes p-channel MOS transistors 14 to 16 and a sense unit 17. When data is read, sense amplifier 4 senses the data read from the memory cell transistor MT onto a bit line BL and amplifies the data. Specifically, sense amplifier 4 supplies voltage VDD transferred by MOS transistor 16 to node N6 via sense unit 17, thereby precharging any one of the bit lines BL. Then, for example, the sense unit 17 senses the voltage (or current) at node N6.

When data is written, sense amplifier 4 transfers voltage VDDSA transferred from MOS transistor 14 to the bit line BL. More specifically, sense amplifier 4 transfers to node N6 voltage VDDSA supplied from MOS transistor 14, voltage VDD, or 0 [V] output as a result of the MOS transistor (not shown) included in sense unit 17 being grounded. That is, sense amplifier 4 transfers write data to the bit line BL.

Data is read from or written onto one of the two adjacent bit lines BL. Groups of two adjacent bit lines BL include a group of bit line BL0 and bit line BL1, a group of bit line BL2 and bit line BL3, a group of bit line BL4 and bit line BL5, and the like. That is, of an n number of bit lines BL, data is read from or written onto an n/2 number of bit lines BL at the same time. Hereinafter, of the groups of bit lines BL, the bit line BL to be read from or written onto is referred to as the selected bit line BL and the bit line neither to be read from nor written onto is referred to as the unselected bit line BL.

Furthermore, sense unit 17 latches sense data or performs an operation on the latched data. When sense unit 17 latches sense data or performs an operation on the latched data, MOS transistor 15 transfers voltage VDD at node N5 to the sense unit 17. Next, MOS transistors 14 and 15 provided in the sense amplifier 4 will be explained.

<P-Channel Transistors 14, 15>

Next, p-channel transistors 14, 15 will be explained. Each of p-channel transistors 14, 15 is formed on the same well. One end of the current path of MOS transistor 14 is connected to node N4. The other end of the current path is connected to sense unit 17. One end of the current path of MOS transistor 15 is connected to node N5. The other end of the current path is connected to the sense unit 17. The VDDSA generator circuit 9, described later, applies either voltage VDDSA or voltage VDD to node N4. The VDD generator circuit 10, described later, applies voltage VDD to node N5.

Then, when external voltage Vext2 is applied to the NAND flash memory, MOS transistor 14 transfers voltage VDDSA to node N6 via sense unit 17 in a write operation. In addition, when external voltage Vext1 is applied to the NAND flash memory, MOS transistor 14 transfers voltage VDD to node N6 via sense unit 17 in a write operation.

MOS transistor 15 supplies voltage VDD at node N5 to sense unit 17. With voltage VDD being supplied, sense unit 17 performs a desired operation. Next, sense amplifier 4 will be explained in detail with reference to FIG. 3.

<Details of Sense Amplifier 4>

FIG. 3 is a detailed circuit diagram of the sense unit 17 and MOS transistors 14 to 16 of FIG. 1. As shown in FIG. 3, sense unit 17 includes a primary data cache (PDC), a secondary data cache (SDC), a dynamic data cache (DDC), and a temporary data cache (TDC).

The SDC, which is composed of clocked inverter circuits 80, 81 constituting a latch circuit and n-channel MOS transistors 82, 83, can operate on voltage VDD. That is, VDD generator circuit 10 applies voltage VDD to the SDC, enabling the SDC to operate. One end of the current path of MOS transistor 82 is connected to the output end of clocked inverter circuit 80 at node N2a. The other end of the current path of MOS transistor 82 is connected to the output end of clocked inverter circuit 81 at node N2b. Each of clocked inverter circuits 80 and 81 includes a MOS transistor 15. That is, one end of the current path of MOS transistor 15 included in each of clocked inverter circuits 80 and 81 is connected to node N5. The other end of the current path is connected electrically to nodes N2a and N2b. The configuration of each of clocked inverter circuits 80 and 81 will be described later. Signal EQ2 is supplied to the gate of MOS transistor 82. One end of the current path of MOS transistor 83 is connected to the output end of clocked inverter circuit 81 at node N2b. The other end of the current path is grounded. Signal PRST is supplied to the gate of transistor 83. One end of the current path of column select MOS transistor 84 is connected to node N2a. The other end of the current path is connected to input-output data line IOn. One end of the current path of column select transistor 85 is connected to node N2b. The other end of the current path is connected to input-output data line IO. When there is no need to distinguish between input-output data lines IOn, IO, they will simply be referred to as input-output data lines IO. Column selection signal CSLi is supplied to the gates of these MOS transistors 84 and 85. That is, signal CSLi turns on MOS transistors 84, 85, causing data to be input from or output to input-output data lines IO. One end of the current path of MOS transistor 86 is connected to node N2a. The other end of the current path is connected to node N12. One end of the current path of MOS transistor 87 is connected to node N12. The other end of the current path is connected to node N1a of the PDC. Signal BLC2 is supplied to the gate of MOS transistor 86. Signal BLC1 is supplied to the gate of transistor 87.

The PDC, which is composed of clocked inverter circuits 88, 89 and n-channel MOS transistor 90, can operate on voltage VDDSA. That is, the VDDSA generator circuit 9 supplies voltage VDDSA to the PDC, enabling the PDC to operate. One end of the current path of MOS transistor 90 is connected to the output end of clocked inverter circuit 88 at node N1b. The other end of the current path is connected to the output end of clocked inverter circuit 89 at node N1a. Clocked inverter circuit 89 includes MOS transistor 14. One end of the current path of MOS transistor 14 is connected to node N4. The other end of the current path is connected electrically to node N1a. That is, voltage VDDSA supplied from node N4 is supplied to bit line BL via MOS transistor 14 included in clocked inverter circuit 89, node N1a, and node N12. The configuration of each of clocked inverter circuits 88 and 89 will be described later. Signal EQ1 is supplied to the gate of MOS transistor 90. Node N1b of the PDC is connected to the gate of MOS transistor 91. One end of the current path of MOS transistor 91 is connected to the current path of MOS transistor 92. The other end of the current path is connected to one of the current path of MOS transistors 93 and 94 constituting a transfer gate. The other end of the current path of MOS transistor 92 is grounded. Signal CHK1 is supplied to the gate of MOS transistor 92. Signal CHK2 is supplied to the gate of MOS transistor 93. Signal COMi is supplied to the other end of the current path of MOS transistors 93 and 94. Signal COMi, which is also used in the sense amplifier 4, is a signal that indicates whether a verify operation is completed in sense unit 17. That is, as explained later, when a verify operation has been completed, node N1b of the PDC goes low. In this state, if signals CHK1, CHK2 are high, signal COMi goes high when a verify operation has been completed. The gate of MOS transistor 94 is connected to the other end of the current path of MOS transistor 86 and one end of the current path of MOS transistor 87.

The TDC is composed of, for example, MOS capacitor 95. One electrode of capacitor 95 is connected to node N12. The other electrode of capacitor 95 is grounded. One end of the current path of MOS transistor 96 is connected to connection node N12. The DDC is connected to the other end of the current path of MOS transistor 96. Signal REG is supplied to the gate of MOS transistor 96.

The DDC is composed of n-channel MOS transistors 97 and 98. Signal VREG is supplied to one end of the current path of MOS transistor 97. The other end of the current path is connected to the other end of the current path of MOS transistor 96. The gate of MOS transistor 97 is connected to one end of the current path of MOS transistor 98 and further connected to node N1a of the PDC via the other end of the current path of MOS transistor 98. Signal DTG is supplied to the gate of MOS transistor 98.

One end of the current path of MOS transistors 99 and 100 is connected to node N12. One end of the current path of MOS transistor 16 is connected to the other end of MOS transistor 100. Signal BLPRE is supplied to the gate of MOS transistor 100. That is, the other end of MOS transistor 16 is connected to node N5. From node N5, signal VPRE, or voltage VDD, is supplied. That is, when data is read, voltage VDD is supplied to bit line BL via MOS transistor 100 and node N12. Signal BLCLAMP is supplied to the gate of MOS transistor 99. The other end of the current path of MOS transistor 99 is connected to one end of the current path of MOS transistor 101. The other end of the current path of MOS transistor 101 is connected to one end of the current path of MOS transistor 102 and bit line BL(i+1) in a common connection manner. Signal BLS(i+1) is supplied to the gate of MOS transistor 101. One end of the current path of p-channel MOS transistor 105 functioning as a nonselective circuit 5 is connected to the other end of the current path of MOS transistor 102. The other end of the current path of MOS transistor 105 is connected to node N4. That is, voltage VDDSA serving as signal BLCRC is supplied to the other end of the current path of MOS transistor 102 via MOS transistor 105. Signal BlAS(i+1) is supplied to the gate of MOS transistor 102. One end of the current path of MOS transistor 104 is connected to the other end of the current path of MOS transistor 99. The other end of the current path is connected to one end of the current path of MOS transistor 103 and bit line BLi. Signal VLSi is supplied to the gate of MOS transistor 104. Signal BlASi is supplied to the gate of MOS transistor 103. The other end of the current path of MOS transistor 103 is connected to the other end of the current path of MOS transistor 102 in a common connection manner. That is, signal BLCRL is supplied to the other end of the current path of MOS transistor 103. MOS transistors 102, 103 and MOS transistors 101, 104 are turned on according to signal BlAS(i+1) and signal BlASi in a complementary manner, thereby supplying signal BLCRL, or voltage VDDSA, to unselected bit line BL. Hereinafter, even-numbered bit line BL is referred to as bit line BLi (i is an even number where i=0, 2, 4, . . . , n) and odd-numbered bit line BL is referred to as bit line BL(i+1).

The various signals and voltages explained above are generated by the VDDSA generator circuit 9, VDD generator circuit 10, and control circuit (not shown) in FIG. 1. Desired arithmetic processing and the operation of transferring voltage VDDSA and voltage VDD are performed under the control of the VDDSA generator circuit 9 and VDD generator circuit 10 and the control signals.

Next, the function of each of the SDC, PDC, and DDC will be explained. The SDC, PDC, and DDC hold input data in a write operation, holding read data in a read operation, and temporarily holding data in a verify operation, or storing. The SDC, PDC, and DDC are used to manipulate internal data in storing, for example, binary data ("0" or "1") in a memory cell transistor MT. The DTC is used to manipulate internal data in amplifying data on bit line BL in a read operation and not only holding the data temporarily but also storing, for example, binary data.

When data is written, write data is stored into the SDC from input-output data line IO. When a write command is externally input, the SDC transfers write data held in the SDC to the PDC. Specifically, when signals BLC1 and BLC2 turn on MOS transistors 86 and 87, the potential at node N2a is stored in the PDC via node N12, MOS transistor 87, and node N1a. For example, if the stored data is "1" (here, defined as not writing data), the potential at node N1a is made high. Conversely, if the stored data is "0" (here, defined as writing data), the potential at node N1a is made low.

In a write operation, the PDC holds the write data transferred from the SDC. Then, when signals BLC1, BLCLAMP, and BLSi or BLS(i+1) turn on MOS transistors 87, 99, and 101 or 104, the PDC transfers the write data to bit line BL. If the write data is "1" data, bit line BL is kept at voltage VDDSA. If the write data is "0" data, bit line BL is set at a potential of zero.

In a verify operation, when signal DTG turn on MOS transistor 98, the PDC transfers the data held in the PDC to the DDC. Then, when signal BLC1 turns on MOS transistor 87, the PDC stores the data transferred from the TDC. The data transferred from the TDC is the data held in the DDC before signal DTG turned on MOS transistor 98.

<Details of Clocked Inverters 88, 89 and Clocked Inverters 80, 81>

As described above, clocked inverters 88, 89 and clocked inverters 80, 81 are configured to include MOS transistors 14, 15, respectively. FIGS. 4 and 5 are circuit diagrams of clocked inverters 88, 89 and clocked inverters 80, 81. First, referring to FIG. 4, clocked inverters 88, 89 and 80, 81 will be explained in detail. As shown in FIG. 4, clocked inverter 80 includes p-channel MOS transistors 15, 110 and n-channel MOS transistors 111, 112. As described above, one end of the current path of MOS transistor 15 is connected to node N5. The other end of the current path of MOS transistor 15 is connected to one end of the current path of MOS transistor 110. The gate of MOS transistor 15 is connected to the output end of clocked inverter 81 (represented as N2b in FIG. 4).

The other end of the current path of MOS transistor 110 is connected to one end of the current path of MOS transistor 111. Signal SEN1 is supplied to the gate of MOS transistor 110. The other end of the current path of MOS transistor 110 serves as the output end (represented as N2a in FIG. 4) of clocked inverter 80. The output end (N2a) is connected to clocked inverter 81.

The other end of the current path of MOS transistor 111 is connected to one end of the current path of MOS transistor 112. Signal SEN1 is supplied to the gate of MOS transistor 111. The other end of the current path of MOS transistor 112 is grounded. The output end of clocked inverter 81 is connected to the gate of MOS transistor 112. That is, the gates of MOS transistors 15 and MOS transistor 112 are connected in a common connection manner.

Next, the configuration of clocked inverter 81 will be explained. As shown in FIG. 4, clocked inverter 81 includes p-channel MOS transistors 15, 113 and n-channel MOS transistors 114, 115. As described above, one end of the current path of MOS transistor 15 is connected to node N5. The other end of the current path is connected to one end of the current path of MOS transistor 113. The gate of MOS transistor 15 is connected to the output end of clocked inverter 80 (represented as N2a in FIG. 4).

The other end of the current path of MOS transistor 113 is connected to one end of the current path of MOS transistor 114. Signal SEN1 is supplied to the gate of MOS transistor 113. The other end of the current path of MOS transistor 113 serves as the output end (represented as N2b in FIG. 4) of clocked inverter 81. The output end (N2b) is connected to clocked inverter 80.

The other end of the current path of MOS transistor 114 is connected to one end of the current path of MOS transistor 115. Signal SEN1 is supplied to the gate of MOS transistor 114. The other end of the current path of MOS transistor 115 is grounded. The output end of clocked inverter 80 is connected to the gate of MOS transistor 115. That is, the gates of MOS transistors 15 and MOS transistor 115 are connected in a common connection manner.

Moreover, the configuration of clocked inverter 88 will be explained. As shown in FIG. 4, clocked inverter 88 includes p-channel MOS transistors 120, 121 and n-channel MOS transistors 122, 123. One end of the current path of MOS transistor 120 is connected to node N4. The other end of the current path is connected to one end of the current path of MOS transistor 121. The gate of MOS transistor 120 is connected to the output end of clocked inverter 89 (represented as N1a in FIG. 4).

The other end of the current path of MOS transistor 121 is connected to one end of the current path of MOS transistor 122. Signal SEN1 is supplied to the gate of MOS transistor 121. The other end of the current path of MOS transistor 121 serves as the output end (represented as N1b in FIG. 4) of clocked inverter 88. The output end (N1b) is connected to clocked inverter 89.

The other end of the current path of MOS transistor 122 is connected to one end of the current path of MOS transistor 123. Signal SEN1 is supplied to the gate of MOS transistor 122. The other end of the current path of MOS transistor 123 is grounded. The output end of clocked inverter 89 is connected to the gate of MOS transistor 123. That is, the gates of MOS transistors 120 and MOS transistor 123 are connected in a common connection manner.

Next, the configuration of clocked inverter 89 will be explained. As shown in FIG. 4, clocked inverter 89 includes p-channel MOS transistors 14, 124 and n-channel MOS transistors 125, 126. As described above, one end of the current path of MOS transistor 14 is connected to node N4. The other end of the current path is connected to one end of the current path of MOS transistor 124. The gate of MOS transistor 14 is connected to the output end of clocked inverter 88 (represented as N1B in FIG. 4).

The other end of the current path of MOS transistor 124 is connected to one end of the current path of MOS transistor 125. Signal SEN1 is supplied to the gate of MOS transistor 124. The other end of the current path of MOS transistor 124 serves as the output end (represented as N1a in FIG. 4) of clocked inverter 89. The output end (N1a) is connected to clocked inverter 88.

The other end of the current path of MOS transistor 125 is connected to one end of the current path of MOS transistor 126. Signal SEN1 is supplied to the gate of MOS transistor 125. The other end of the current path of MOS transistor 126 is grounded. The output end of clocked inverter 88 is connected to the gate of MOS transistor 126. That is, the gates of MOS transistors 14 and MOS transistor 126 are connected in a common connection manner.

The configuration of each of clocked inverters 80, 81, 88, 89 is not limited to FIG. 4. That is, they may be configured as described below in terms of the layout of sense amplifier 4. FIG. 5 is a circuit diagram of clocked inverters 80, 81, 88, 89. Explanation of the same configuration as that of FIG. 4 will be omitted. As shown in FIG. 5, clocked inverter 80 may be so configured that signal SEN1 is supplied to the gates of MOS transistors 15 and 112 and the output end (N2b) of clocked inverter 81 is connected to the gates of MOS transistors 113 and 114. Similarly, clocked inverter 81 may be so configured that signal SEN1 is supplied to the gates of MOS transistors 15 and 115 and the output end (N2a) of clocked inverter 80 is connected to the gates of MOS transistors 113 and 114.

Moreover, as shown in FIG. 5, clocked inverter 88 may be so configured that signal SEN1 is supplied to the gates of MOS transistors 120 and 123 and the output end (N1a) of clocked inverter 89 is connected to the gates of MOS transistors 121 and 122. Similarly, clocked inverter 89 may be so configured that signal SEN1 is supplied to the gates of MOS transistors 14 and 126 and the output end (N1b) of clocked inverter 88 is connected to the gates of MOS transistors 124 and 125.

<Sectional Configuration of MOS Transistors 14, 15>

Figure 6:
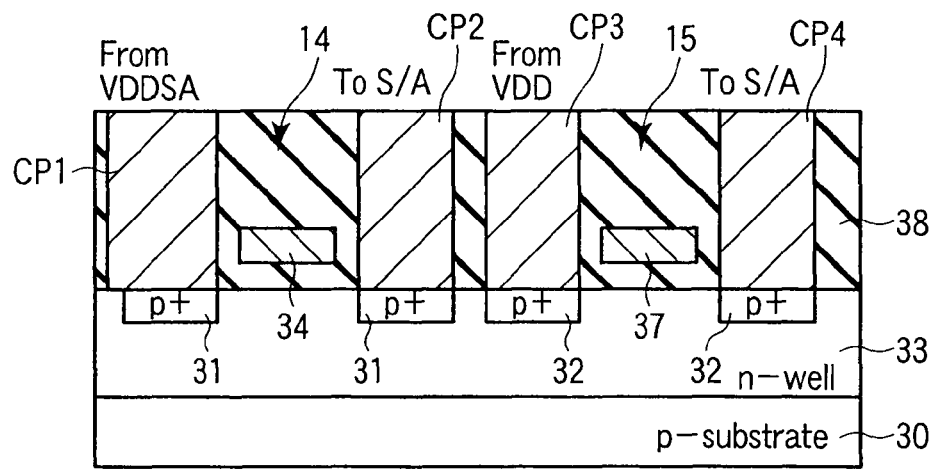
FIG. 6 is a sectional view of a MOS transistor according to the embodiment.

Next, a sectional configuration of MOS transistors 14, 15 will be explained. As described above, MOS transistors 14, 15 are formed on the same well as shown in FIG. 6. As shown in FIG. 6, MOS transistors 14, 15 are formed on a p-type semiconductor substrate 30. An n-well region 33 is formed at the surface of the p-type semiconductor substrate 30. An insulating film 38 is formed on the p-type semiconductor substrate 30 so as to cover MOS transistors 14, 15.

MOS transistor 14 includes a gate electrode 34 provided above the p-type semiconductor substrate 30 via a gate insulating film (not shown) and an impurity diffused layer 31 which is provided at the surface of the n-well region 33 and functions as a source and a drain. On the drain region of MOS transistor 14, contact plug CP1 is formed. Contact plug CP1 is connected to the output end of VDDSA generator circuit 9, that is, nodes N1, N2, and N4. On the source region of MOS transistor 14, contact plug CP2 is formed. Contact plug CP2 is connected to an even-numbered bit line BL via sense amplifier 4.

MOS transistor 15 includes a gate electrode 37 provided above the p-type semiconductor substrate 30 via a gate insulating film (not shown) and an impurity diffused layer 32 which is provided at the surface of the n-well region 33 and functions as a source and a drain. On the drain region of MOS transistor 15, contact plug CP3 is formed. Contact plug CP3 is connected to the output end of VDD generator circuit 10, that is, nodes N3, and N5. On the source region of MOS transistor 15, contact plug CP4 is formed. Contact plug CP4 is connected to an even-numbered bit line BL via sense amplifier 4.

<MOS Transistors TR, TR'>

Next, MOS transistors TR, TR' will be explained. One end of the current path of each of MOS transistors TR0 to TR(n+1) is connected to node N6 and the other end of the current path is connected to the corresponding one of bit line BL0 to bit line BL(n+1). That is, MOS transistors TR connect bit line BLi and bit line BL(i+1) to the sense amplifier 4.

Furthermore, one end of the current path of each of MOS transistors TR'0 to TR'(n+1) is connected to the nonselective circuit 5 via node N8 and the other end of the current path is connected to either bit line BLi or bit line BL(i+1). That is, MOS transistors TR' connect bit line BLi and bit line BL(i+1) to sense amplifier 4.

Sense amplifier 4 and nonselective circuit 5 are provided for each group of bit lines BL explained in connection with sense amplifier 4. More specifically, one sense amplifier 4 and one nonselective circuit 5 are provided for a group of bit line BL0 and bit line BL1 and one sense amplifier 4 and one nonselective circuit 5 are provided for a group of bit line BL2 and bit line BL3. The same holds true for the remaining groups. In a write operation and a read operation, one of a pair of bit lines BL is connected to sense amplifier 4 by MOS transistor TR and the other of the pair is connected to the nonselective circuit 5 by MOS transistor TR'.

<Nonselective Circuit 5>

Next, nonselective circuit 5 will be explained. Nonselective circuit 5 connects node N4 to node N8. Nonselective circuit 5 performs on/off control of MOS transistors TR, TR', thereby enabling either an even-number bit line BLi or an odd-numbered bit line BL(i+1) to be connected to either sense amplifier 4 or nonselective circuit 5.

Specifically, nonselective circuit 5 turns on MOS transistor TR corresponding to the selected bit line BL and turns off MOS transistor TR', which connects the selected bit line BL to node N6 and sense amplifier 4. That is, nonselective circuit 5 transfers the voltage transferred by either MOS transistor 14 or 15 or 0 V to the selected bit line BL.

Moreover, nonselective circuit 5 turns off and on MOS transistors TR, TR' corresponding to the unselected bit line BL, respectively, which connects the unselected bit line BL to the nonselective circuit 5.

<VDDSA Generator Circuit 9>

VDDSA generator circuit 9 generates voltage VDDSA from voltage Vext2 supplied from the outside. Then, VDDSA generator circuit 9 transfers either the generated voltage VDDSA or voltage VDD to bit line BL. Then, when "1" data is written into the memory cell transistor MT, VDDSA generator circuit 9 transfers voltage VDDSA to the bit line corresponding to the memory cell transistor MT. VDDSA generator circuit 9 transfers voltage VDDSA the unselected bit lines BL. That is, VDDSA generator circuit 9 transfers either voltage VDDSA or voltage VDD to the bit lines BL via nodes N1, N2, N4, and sense amplifier 4 or nonselective circuit 5.

<VDD Generator Circuit 10>

External voltage Vext1 or Vext2 is supplied to VDD generator circuit 10. On the basis of the voltage, VDD generator circuit 10 outputs voltage VDD to nodes N3, N5.

When external voltage Vext2 is supplied, VDD generator circuit 10 steps down Vext2 to produce voltage VDD (=1.8 [V]) and outputs voltage VDD to nodes N3 and N5. When external voltage Vext1 (=VDD) is supplied, VDD generator circuit 10 outputs VDD as it is to nodes N3, N5.

<Detection Circuit 7>

Detection circuit 7 is connected to node N1 connected to the output end of VDDSA generator circuit 9. When having sensed that voltage VDDSA at node N1 has dropped to voltage VDD or below, detection circuit 7 instructs short circuit 8 to short-circuit the output end of VDDSA generator circuit 9 and the output end of VDD generator circuit 10. That is, detection circuit 7 short-circuits node N2 and node N3, which causes voltage VDD to be supplied to sense amplifier 4 and nonselective circuit 5. Detection circuit 7 instructs short circuit 8 to electrically connect node N2 and nod N3 unless VDDSA generator circuit 9 supplied with external voltage Vext2 outputs voltage VDDSA. That is, when data is read or external voltage Vext1 is supplied, detection circuit 7 instructs short circuit 8 to electrically connect node N2 and node N3.

<Short Circuit 8>

Short circuit 8 is connected to node N2 connected to the output end of VDDSA generator circuit 9 and to node N3 connected to the output end of VDD generator circuit 10. Receiving the control signal from detection circuit 7, short circuit 8 short-circuits node N2 and node N3, causing the both terminals to have the same potential, voltage VDD.

<Details of Detection Circuit 7 and Short Circuit 8>

Figure 7:
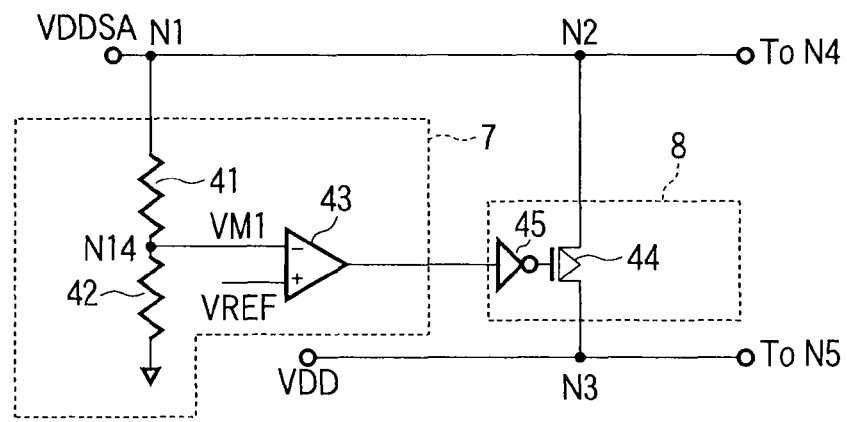
FIG. 7 is a block diagram of a detection circuit and a short circuit according to the embodiment.

Next, detection circuit 7 and short circuit 8 will be explained in detail with reference to FIG. 7. FIG. 7 is a circuit diagram of detection circuit 7 and short circuit 8. As shown in FIG. 7, detection circuit 7 includes resistive elements 41, 42 and a comparator 43. Short circuit 8 includes, for example, a p-channel MOS transistor 44 which functions as a switch and an inverter 45.

As shown in FIG. 7, resistive element 41 has one end connected to node N1 and the other end connected to one end of resistive element 42 via node N14. The other end of resistive element 42 is grounded. That is, voltage VDDSA at node N1 is divided by resistive elements 41, 42 and the divided voltage is output at node N14.

Reference voltage VREF generated at, for example, a BGR circuit (not shown) is input to the inverting input terminal of comparator 43. Node N14 is connected to the noninverting terminal of comparator 43. That is, comparator 43 compares reference voltage VREF with the potential at node N14 (here, let the potential at node N14 be voltage VM1). If VREF>VM1, comparator 43 outputs a high-level signal to inverter 45. As a result, inverter 45 inverts the signal from comparator 43 and outputs a low level signal to the gate of MOS transistor 43. That is, if the potential at node N1 becomes lower than voltage VDD, MOS transistor 43 is turned on, short-circuiting node N2 and node N3. If VREF<VM1, comparator 43 outputs a low level signal to inverter 45. As a result, inverter 45 inverts the signal from comparator 43 and outputs a high level signal to the gate of MOS transistor 43. Node N1 and node N2 are caused to have the same potential.

One end of the current path of MOS transistor 44 is connected to node N2. The other end of the current path is connected to node N3. The signal from comparator 43 is input to the gate of MOS transistor 44. Accordingly, comparator 43 outputs the high level signal, turning on MOS transistor 44, which short-circuits node N2 and node N3, or causes node N2 and node N3 to have the same potential.

<Details of VDDSA Generator Circuit 9>

Next, VDDSA generator circuit 9 will be explained in detail with reference to FIG. 8. FIG. 8 shows a circuit configuration of VDDSA generator circuit 8. As shown in FIG. 8, VDDSA generator circuit 9 includes a first voltage generator unit 47, a second voltage generator unit 48, and a p-channel MOS transistor 56.

<First Voltage Generator Unit 47>

First, the configuration of the first voltage generator unit 47 will be explained. The first voltage generator unit 47 includes a comparator 50, a p-channel MOS transistor 51, an n-channel MOS transistor 52, a resistive element 53, and a step-up resistance unit 54. Let the threshold value of MOS transistor 51 be Vt.

As shown in FIG. 8, one end of the current path of MOS transistor 51 is connected to node N15. The other end of the current path is connected to one end of the current path of MOS transistor 52 via node N16. External voltage Vext2 higher than voltage VDDSA is applied to node N15. The other end of the current path of MOS transistor 52 is connected to one end of resistive element 53 via node N17. The gate of MOS transistor 52 is connected to node N16 in a common connection manner. That is, MOS transistor 52 is in diode connection, with the voltage at node N16 supplied to its gate. The potential at node N16 is set at voltage VM2. The voltage VM2 is applied to the gate of MOS transistor 52. That is, the potential difference between one end and the other end of the current path of MOS transistor 52 and the potential difference between the other end of the current path and the gate have the same value. Accordingly, MOS transistor 52 functions as a pentode. Let the potential at node N17 be voltage VM3. Voltage VM3 is determined by the load characteristics of resistive element 53 and step-up resistance unit 54 and the current-voltage characteristic of MOS transistor 52. Then, voltage VM3 at node N17 is divided by resistive element 53 and step-up resistance unit 54. The other end of resistive element 53 is connected to one end of step-up resistance unit 54 via node N18.

Step-up resistance unit 54 includes a decoder 55, a k number (k: a natural number) of resistive elements 54-1, 54-2, ..., 54-k and a k number of n-channel MOS transistors Tr54-1, Trt54-2, ..., Tr54-k. Let the resistance values of resistive elements 54-1, 54-2, ..., 54-k be R1, R2, ..., Rk, respectively. That is, on the basis of the result of decoding the signals supplied from the control unit (not shown), decoder 55 turns on at least one of MOS transistors 54-j (j is one of 1 to k). That is, one end of the current path of MOS transistor 54-j in the on state is grounded, causing resistive element 54-j corresponding to MOS transistor 54-j and resistive element 53 to divide the potential at node N7. Here, let the voltage at node N18 be VM4.

Reference voltage VREF generated at, for example, the BGR circuit is supplied to the inverting input terminal of comparator 50. Reference voltage VREF has a value corresponding to the detection level of node N18. Voltage VM4 at node N18 to which the other end of resistive element 53 and one end of each of resistive elements 54-0 to 54-k are connected is supplied to the noninverting terminal of comparator 50. That is, comparator 50 controls the on or off state of MOS transistor 51 so that reference voltage VREF supplied to comparator 50 may coincide with voltage VM4 at node N18. That is, comparator 50 compares reference voltage VREF with voltage VM4 and, if VREF<VM4, outputs a high level signal to the gate of MOS transistor 51, which turns off MOS transistor 51. Accordingly, the supply of voltage from node N15 to node N16 is stopped. If VREF≧VM4, comparator 50 outputs a low level signal to the gate of MOS transistor 51, which turns on MOS transistor 51. Accordingly, voltage is supplied from node N15 to node N16, with the result that the voltage at node N16 reaches voltage VM2. The maximum value that voltage VM2 can take is a value obtained by subtracting the threshold value of MOS transistor 51, or Vt, from the voltage applied to the gate of MOS transistor 51. The value of voltage VM2 can be made variable by selecting the resistive element of the step-up resistance unit 54 arbitrarily.

Here, suppose the resistance value of step-up resistance unit 54 when voltage VM2 is voltage V1$_{VDD}$ is R2. If the resistance value of step-up resistance unit 54 is R1 lower than R2, the potential at node N18 becomes higher than when the resistance value is R2. This is because, as a result of a drop in voltage VM4 at node N18, comparator 50 outputs a low level to raise voltage VM4. This enables node N16 to output voltage V1$_{VDDSA}$ higher than voltage V1$_{VDD}$. In this way, the value of voltage VM2 output at node N11 is controlled by controlling the resistance value of step-up resistance unit 54.

<Second Voltage Generator Unit 48>

Next, the second generator unit 48 will be explained. The second generator unit 48 includes n-channel MOS transistors 57, 60 and resistive elements 58, 59. Let the threshold value of MOS transistor 57 be Vt.

As shown in FIG. 8, node N16 (node N19) in the first voltage generator unit 47 is connected to the gate of MOS transistor 57. That is, voltage VM2 output from node N16 is transferred to the gate of MOS transistor 57 via node N19. One end of the current path of MOS transistor 56 is connected to node N19. The other end of the current path is grounded. Signal disc1 is supplied to the gate of MOS transistor 56. That is, signal disc1 turns on MOS transistor 56, causing node N16 and node N19 to be grounded.

One end of the current path of MOS transistor 57 is connected to node N10. The other end of the current path is connected to one end of resistive element 58 via node N11. The other end of resistive element 58 is grounded. One end of resistive element 59 is connected to one end of resistive element 58 at node N11 in a common connection manner. The other end of resistive element 59 is connected to one end of the current path of MOS transistor 60. The other end of the current path of MOS transistor 60 is grounded. Signal disc2 is supplied to the gate of MOS transistor 60. Signal disc2 is supplied from, for example, the control unit (not shown). When signal disc2 goes high, this turns on MOS transistor 60, connecting resistive elements 58, 59 in parallel. That is, the combined resistance value of resistive elements 58, 59 is lower than the resistance value of resistive element 58 alone.

Node N11 is charged at external voltage Vext2 up to the potential obtained by subtracting the threshold value of MOS transistor 57, or Vt, from voltage VM2. However, since resistive elements 58, 59 have finite resistance values, the potential at node N11 is set on the basis of the electrical characteristic of MOS transistor 57 and the load curve of resistive elements 58, 59. With MOS transistor 60 in the off state, when voltage V1$_{VDDSA}$ is transferred to the gate of MOS transistor 57, the resistance value of resistive element 58 is such that the potential at node N11 is made voltage VDDSA. Similarly, with MOS transistor 60 in the off state, when voltage V1$_{VDD}$ is transferred to the gate of MOS transistor 57, the resistance value of resistive element 58 is such that the potential at node N11 is made voltage VDD. Hereinafter, a case where voltage V1$_{VDD}$ is applied to the gate of MOS transistor 57 will be explained with reference to FIG. 9. FIG. 9 is an I-V characteristic of the second voltage generator unit 48. Specifically, FIG. 9 shows an I-V characteristic of MOS transistor 57 and a load characteristic of resistive elements 58, 59. FIG. 9 is a graph showing a case where either voltage VDD or voltage VDD' is output from node N11. The value of current flowing at node N11 is plotted on the ordinate axis and the value of voltage at node N11 is plotted on the abscissa axis. As shown in FIG. 9, when MOS transistor is in the off state and resistive element 59 is in the floating state, the load characteristic depends only on the resistance value of resistive element 58. That is, since the resistance becomes higher than that of the parallel connection of resistive elements 58, 59, the slope of the load line becomes less sharp (represented by line a in FIG. 9). Then, at this time, the voltage at the intersection of line a and MOS transistor 57 (represented by line c in FIG. 9) is used as voltage VDD.

Then, when MOS transistor 60 is turned on, the slope of the load line becomes sharper than that of line a (represented by line b in FIG. 9). Then, at this time, the voltage at the intersection of line b and line c is determined to be voltage VDD' (<voltage VDD). The same holds true when voltage V1$_{VDDSA}$ is applied to the gate of MOS transistor 57. That is, when MOS transistor 60 is turned off, let the potential at node N11 be voltage VDDSA.

When MOS transistor 56 is turned on, the potential at node N9 goes to 0 [V]. This turns off MOS transistor 57, preventing external voltage Vext2 from being supplied from node N10, which causes the potential at node N11 to go to 0 [V].

After outputting voltage VDDSA, VDDSA generator circuit 9 sets the resistance value of step-up resistance unit 54 at R1 unless it is needed, thereby outputting voltage VDD from node N11.

The case where external voltage Vext2 is supplied has been explained. When external voltage Vext1 is supplied to nodes N15, N10, VDDSA generator circuit 9 outputs voltage VDD from node N11. That is, voltage VDD is output from node N11 by setting the resistance value of step-up resistance unit 54 at a desired value.

<Write Operation>

Next, a write operation in the nonvolatile semiconductor memory of the embodiment will be explained, centering on a case where external voltage Vext2 is supplied. As described above, writing is performed at intervals of even-numbered bit line BLi or odd-numbered bit line BL(i+1) in the embodiment. Hereinafter, a case where data is written onto bit line BLi will be explained as an example. In the embodiment, when external voltage Vext2 is supplied, VDDSA generator circuit 9 transfers voltage VDDSA obtained by stepping down external voltage Vext2 to bit line BL, regardless of whether to write "0" data or "1" data. Writing "0" data means the operation of injecting charges in the inverted layer developed in a memory cell transistor MT into a charge storage layer to set, for example, threshold voltage Vth1 of the MOS transistor higher than voltage V01 in FIG. 2. Writing "1" data means the operation of setting threshold voltage Vth0 of memory cell transistor MT lower than voltage V01. When "1" data is written, voltage VDDSA transferred to bit line BL may be referred to as a write inhibit voltage. That is, voltage VDDSA (write inhibit voltage) is transferred to bit line BL to make smaller the potential difference between the control gate and channel, thereby suppressing the injection of electrons into the charge storage layer.

In the embodiment, the write phases are divided into three time series, 1: write preparation, 2: writing, and 3: write verification. Here, 1: write preparation and 2: writing will particularly be explained with reference to FIG. 10. With bit line BLi to be written onto, a "1" data write operation and a "0" data write operation will be explained.

<1: Write Preparation>

First, in the period from time t0 to time t4 in FIG. 10, a write preparation is made. FIG. 10 is a timing chart to explain the potential of signal sgd applied to the gate of select transistor ST1, the potential of the channel, the potential of bit line BLi, the output voltage of VDDSA generator circuit 9, the potential of the selected word line WL, the potential of an unselected word line WL, signal Si, signal S'i, signal S(i+1), and signal S'(i+1).

As shown in FIG. 10, before time t0, VDDSA generator circuit 9 outputs voltage VDD. However, since writing is not performed yet before time t0, each of signal Si, signal S'i, signal S(i+1), and signal S'(i+1) is made low. As a result, MOS transistor TRi, MOS transistor TR'i, MOS transistor TR(i+1), and MOS transistor TR'(i+1) are turned off. Accordingly, sense amplifier 4 does not transfer voltage VDD to bit line BL. That is, at time t0, bit line BL is at 0 [V]. Since signal sgd supplied to the gate of the select transistor is also low, or at 0 {V}, the potential of the channel of the memory cell array is also at 0 [V]. Word line WL corresponding to the selected block BLKs is also at 0 [V].

Then, at time t0, VDDSA generator circuit 9 raises the output voltage from voltage VDD to prepare a data write operation and applies the voltage to node N4. Then, the potential at node N4 is supplied to sense amplifier 4 via MOS transistor 14. Then, signal Si and signal S'(i+1) are made high. As a result, MOS transistor TRi and MOS transistor TR'(i+1) are turned on.

Then, VDDSA generator circuit 9 transfers the output voltage to the selected bit line BLi onto which "1" data is to be written via sense amplifier 4 and MOS transistor MRi. Then, VDDSA generator circuit 9 transfers the output voltage to unselected bit lines BL(i+1) via nonselective circuit 5 and MOS transistor TR'(n+1). As a result, the potential at each of bit line BLi and bit line BL(i+1) starts to rise at time t0. Moreover, signal sgd supplied to the gate of the selected transistor ST1 starts to rise from 0 [V].

Since the threshold value of a memory cell transistor MT in which no data has been written is negative, even if word line WL is at 0 [V], a channel is formed. Sense amplifier 4 has transferred the output potential to the selected bit line BLi. Therefore, at time t1, the potential of the channel (represented as bit line BLi in FIG. 10) corresponding to bit line BLi rises.

Then, at time t2, the output of VDDSA generator circuit 91 reaches voltage VDDSA. Also at time t2, signal sgd is made high, or set at voltage VSG. As a result, the potential of the channel of each of the memory cell transistors MT corresponding to bit line BLi, bit line BLi(i+1) reaches voltage VDDSA. Thereafter, at time t2, signal sgd supplied to the gate of select transistor ST1 is made low, thereby turning off (or cutting off) select transistor ST1. Select transistor ST2 is constantly off. After select transistor ST1 is cut off, VDDSA generator circuit 9 steps down the output voltage from voltage VDDSA to voltage VDD. The channel corresponding to each of bit line BLi and bit line BL(i+1) is made floating at voltage VDDSA. Then, the voltage on each of bit line BLi and bit line BL(i+1) is stepped down to voltage VDD by VDDSA generator circuit 9.

Sense amplifier 4 transfers 0 [V] to bit line BLi onto which "0" data is to be written. As a result, the potential of the channel of memory cell transistor MT corresponding to bit line BLi is also made 0 [V]. Accordingly, bit line BLi remains at 0 [V] after time t0 and the potential on bit line BL(i+1) starts to rise at time t0.

Next, a "1" data write operation and a "0" data write operation will be explained. First, a "1" data write operation will be explained.

<2-1: "1" Data Write Operation>

At time t3, signal sgd starts to rise from 0 [V]. Then, at time t4, signal sgd reaches voltage vsgd. Also at time t4, the potential on the unselected word line WL starts to rise and, at time t5, reaches voltage VPASS. As a result, the potential of the channel in the floating state rises through coupling with a word line (hereinafter, this is referred to as self-boost) and reaches voltage VDDSA+self-boost voltage. At time t5, the potential on the selected word line WL starts to rise and reaches voltage VPGM at time t6. At this time, since the potential difference between the channel of memory cell transistor MT corresponding to bit line BLi and word line WL is a voltage of VPGM−(VDDSA+self-boost voltage), select transistor ST1 is cut off. As a result, the injection of charges is suppressed to a degree that the data held in memory cell transistor MT does not transit to a different level. This causes "1" data to be written into memory cell transistor MT.

Next, the operation of writing "0" data into memory cell transistor MT corresponding to bit line BLi will be explained. The same operation as in writing "1" data will be omitted.

<2-2: "0" Data Write Operation>

As explained in 2-1, signal sgd that started to rise at time t3 reaches voltage vsgd at time t4. Voltage vsgd is the threshold value of select transistor ST1. That is, since the channel corresponding to bit line BLi is at 0 [V], select transistor ST1 is turned on.

Thereafter, the unselected word line WL reaches voltage VPASS at time t5. At time t6, the potential on the selected word line WL reaches voltage VPGM. Since the potential of the channel corresponding to bit line BLi remains at 0 [V], voltage VPGM is applied to the channel. Therefore, charges in the channel are injected into the charge storage layer to a degree that the data held in memory cell transistor MT transits to a different level. As a result, "0" data is written into memory cell transistor MT via bit line BLi.

In the above description, the operation of writing data onto bit line BLi has been explained. Therefore, after time t0, signal S'i and signal S(i+1) are made low. Conversely, when bit line BL(i+1) has been selected, signal S'i and signal S(i+1) are made high and signal Si and signal S'(i+1) are made low. The same holds true for a read operation. A NAND flash memory of the embodiment differs in that, when external voltage Vext1 is supplied, voltage VDD generated by VDD generator circuit 10 is applied to node N4 in the above operation. Accordingly, the voltage output at node N3 is transferred by short circuit 8 to node N4. Since the remaining operation is the same as described above, explanation will be omitted.

<Read Operation>

Next, referring to FIG. 11, the operation of reading "1" data or "0" data on the selected bit line BLi will be explained. An (i+1)-th bit line BL(i+1) adjacent to the selected bit line BLi is made unselected. A voltage sense method will be explained. As described above, one sense amplifier 4 is provided for adjacent bit line BL. In a read operation, even when external voltage Vext2 has been supplied, VDDSA generator circuit 9 outputs voltage VDD and the short circuit short-circuits node N2 and node N3. In this case, the nonvolatile semiconductor memory of the embodiment operates on voltage VDD.

Figure 11:
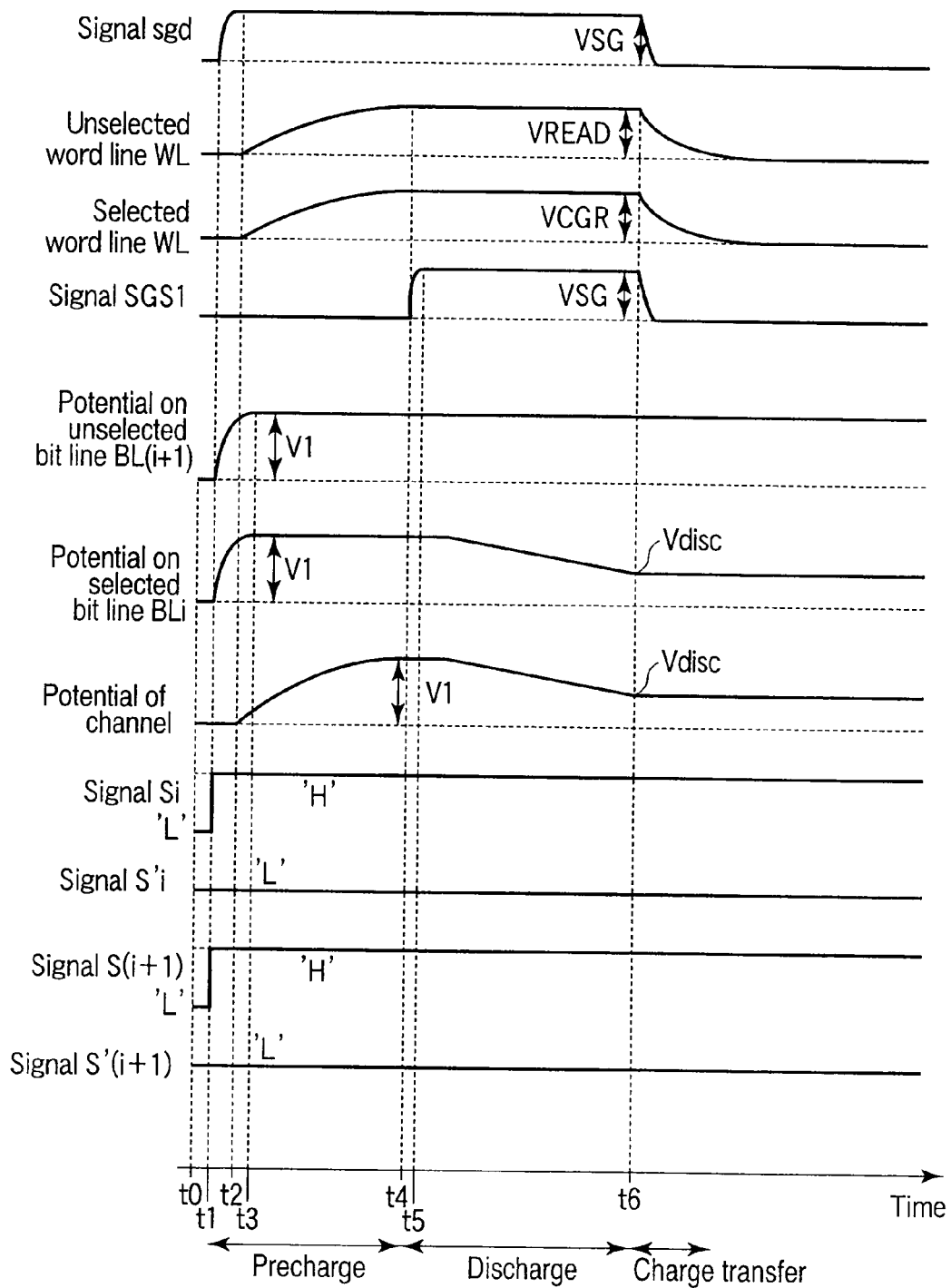
FIG. 11 is a timing chart to explain a read operation of the nonvolatile semiconductor memory according to the embodiment, showing signal sgd, a selected word line WL, the selected word line WL, signal sgs, an unselected bit line BL, the selected bit line BL and its channel, signal Si, signal S'i, signal S(i+1), and signal S'(i+1)

FIG. 11 is a timing chart to explain the potential of signal sgd applied to the gate of select transistor ST1, the potentials on the unselected word line WL and the selected word line WL, signal supplied to the gate of selected transistor ST2, the potentials on the unselected bit BL and the selected bit line BL (and on the corresponding channels), signal Si, signal S'i, signal S(i+1), and signal S'(i+1).

<Precharging>

Signal Si and signal S(i+1) made low at time t0 are made high at time t1. Also at time t1, signal sgd rises. This causes voltage VDD output from VDDSA generator circuit 9 and VDD generator circuit 10 to be transferred to bit line BLi and bit line BL(i+1). That is, at time t1, the potentials on bit line BLi and bit line BL(i+1) start to rise. Then, at time t2, signal sgd reaches voltage VSG. Also at time t2, word line WL driver starts to raise the potentials on the selected word line WL and unselected word line WL. Accordingly, at time t2, the potential of the channel corresponding to bit line BLi starts to rise.

Then, at time t3, the selected bit line BLi and unselected bit line BL(i+1) are charged to voltage V1 (<voltage VDD).

Thereafter, at time t4, the potential on the selected word line WL reaches voltage VCGR and the potential on the unselected word line WL reaches voltage VREAD. Accordingly, the potential of the channel of the memory cell array corresponding to the selected bit line BLi reaches voltage V1 at time t4.

<Discharging>

Then, at time t4, signal sgs supplied to the gate of select transistor ST2 starts to rise from 0 [V] and reaches voltage VSG at time t5. Accordingly, select transistor ST2 is turned on, which discharges the potential on bit line BLi charged to voltage V1.

<Sensing>

Thereafter, at time t6, each of signal sgd and signal sgs starts to fall. This causes the discharge of the voltage on bit line Bi to stop. Let the potential on bit line BLi at this time be voltage Vdisc. Then, if voltage Vdisc on bit line BLi after the discharge is lower than the threshold voltage of the MOS transistor connected to a latch circuit (not shown) included in the sense amplifier 4, sense amplifier 4 determines that bit line BLi has "1" data on it. If voltage Vdisc on bit line BLi is higher than the threshold voltage, sense amplifier 4 determines that bit line BLi has "0" data on it. Since the capacitance of bit line BLi is higher than the capacitance of the capacitor (not shown) included in sense amplifier 4, the principle on which the potential of the capacitor transits to the potential on bit line BLi at the time of sensing is used. This phenomenon is known as charge transfer. This concept is utilized after time t6.

As described above, when transiting from a write operation to another operation in a write operation or a read operation, VDDSA generator circuit 9 outputs voltage VDD from voltage VDDSA.

Next, the operation of switching between voltage VDDSA and voltage VDD in VDDSA generator circuit 9 will be explained with reference to FIG. 12.

<Operation of VDDSA Generator Circuit 9>

FIG. 12 is a timing chart to explain, when output of VDDSA generator circuit 9 is switched from voltage VDD to voltage VDDSA, and it switches to voltage VDD again, the resistance value of step-up resistance unit 54, node N18, the output signal of comparator 50, signal disc1 supplied to MOS transistor 56, node N16, node N19, signal disc2 supplied to the gate of MOS transistor 60, and the potential at node N11. Time t0 to time t1 in FIG. 12 corresponds to the write preparation between time t0 and time t3 in FIG. 10. Then, the period before time t0 and the period from time t1 to time t7 correspond to a read operation and a verify operation as explained in FIG. 11. That is, when data is read, voltage VDD output from node N11 is used in, for example, precharging and discharging in the sense amplifier.

<Before Time t0>

As shown in FIG. 12, before and after t0, an operation other than a write operation, such as a read operation, is switched to a write preparation. Therefore, before time t0, decoder 55 sets the resistance value of step-up resistance unit 54 at R2. At this time, suppose voltage VM4 at node N18 is voltage $V_{N8\_H}$. Accordingly, comparator 50 compares voltage VM4 with reference voltage VREF and outputs a high level to MOS transistor 51. Both signals disc1 and disc2 are made low. This sets nodes N16 and N19 at voltage $V1_{VDD}$ and node N11 at voltage VDD.

<Time t0 to Time t1>

As shown in FIG. 12, after time t0 is passed, a write preparation operation is started to transfer voltage VDDSA to bit line BL.

After time t0 is passed, decoder 55 switches the resistance value of step-up resistance unit 54 from R2 to R1 (<R2). As a result, potential VM4 at node N18 drops (A20). That is, potential VM4 is dropped to voltage $V_{N8\_L}$. As a result of comparing voltage VM4 at node N18 with reference voltage VREF, comparator 50 supplies a low level signal to the gate of MOS transistor 51 to raise the dropped potential VM4 at node N18 (A21). That is, MOS transistor 51 is turned on. This causes the potentials at nodes N16, N19 to start to rise from voltage $V1_{VDD}$. Since a high level is supplied to the gate of MOS transistor 57, the voltage at node N11 starts to rise from voltage VDD. Then, at time t1, nodes N16, N19 are charged to voltage $V1_{VDDSA}$, with the result that the potential at node N11 reaches voltage VDDSA. At this time, both signals disc1 and disc2 are made low.

Consequently, voltage VDDSA for write preparation is output at node N11.

<Time t1 to Time t7>

Next, a timing chart for various signals in the period from time t1 to time t7 will be explained. As shown in FIG. 12, before and after t1, a write preparation operation is switched to a read operation. At time t1, decoder 55 switches the resistance value of step-up resistance unit 54 from R1 to R2 (>R1). As a result, potential VM4 at node N18 rises (A1). Let the potential at node N18 be voltage $V_{N8\_L}$. On the basis of voltage VM4 at node N18 and reference voltage VREF, comparator 50 supplies a high level signal to the gate of MOS transistor 51 to drop the raised voltage VM4 (A2). That is, MOS transistor 51 is turned off. Also at time t1, signal disc1 is made high. This turns on MOS transistor 56. Consequently, the voltage at each of node N16 and node N19 falls from voltage $V1_{VDDSA}$ and reaches 0 [V] at time t1 (A3, A4).

At time t1, signal disc2 is made high. That is, MOS transistor 60 is turned on, causing the potential at node N11 to start to fall from voltage VDDSA (A5, A6).

At time t2, voltage VM4 at node N18 goes to 0 [V]. This is because MOS transistor 51 is turned off, causing the potentials at nodes N16, N19 to drop (A7). Accordingly, comparator 50 compares voltage VM4 with reference voltage VREF at time t2 and outputs a low level signal. This turns on MOS transistor 51, causing the potential at nodes N16, N19 to start to rise (A8). As a result, at time t3, voltage VM2 at node N18 starts to rise (A9).

Then, the potential at node N11 is dropped to voltage VDD' at time t3 and kept at voltage VDD' until time t4 (A10). This is because resistive elements 58 and 59 are connected in parallel with node N11 as a common connection. Thereafter, at time t4, signal disc2 is made low. Consequently, resistive element 59 is made floating and the potential at node N11 rises (A11). At time t5, since the potentials at nodes N16, N19 reach voltage $V1_{VDD}$, the potential at node N18 is made voltage VM4, or voltage $V_{N8\_H}$ (A12) at time t6. Thereafter, at time t7, the potential at node N11 reaches voltage VDD at time t7 (A11).

In this way, voltage at node N11 is switched to voltage VDD.

Effects of the Embodiment

The nonvolatile semiconductor memory according to the embodiment produces the effects described in item 1 to item 3.

(1) Program Disturbance can be Suppressed in Writing "1" Data

Previously, when "1" data was written, voltage VDD used for initial charging was transferred to a channel into which "1" data was to be written and then select transistor ST1 was cut off, thereby making the potential of the channel higher than voltage VDD. This made smaller the potential difference between the control gate and the corresponding channel so as to prevent charges generated in the channel from being injected into the charge storage layer. However, program disturbance occurred.

In contrast, with the nonvolatile semiconductor memory of the embodiment, voltage VDDSA for initial charging higher than in a conventional equivalent is transferred to the channel. After voltage VDDSA is transferred to the channel, select transistor ST1 is cut off. Thereafter, as a result of coupling with word line WL, the potential of the channel rises above voltage VDDSA. Therefore, even when write voltage VPGM is transferred over the selected word line WL, since the potential difference between the control gate functioning as the word line WL and the channel becomes smaller, the voltage of the channel can suppress program disturbance. This is shown in FIG. 13. FIG. 13 shows the shift amount of threshold value of memory cell transistor MT in a "1" data write operation in a case where the potential of the channel is set at voltage VDD or voltage VDDSA, with the shift amount plotted on the ordinate axis and the channel charging potential (represented as BL charging potential in FIG. 13) plotted on the abscissa axis. For clarification, if the potential of the channel is voltage VDD, the shift amount of threshold value of memory cell transistor MT in a "1" data write operation is set at 100%. Voltage VDDSA is 1.56 (represented as 156% in FIG. 13) times as high as voltage VDD. As shown in FIG. 13, if the potential of the channel is voltage VDDSA, the shift amount of threshold value of memory cell transistor MT is 47.8 [%]. That is, in FIG. 2, suppose the potential of the channel is voltage VDD and, at this time, it is assumed 100% in case of the case where threshold valueVTh0 of "1" data becomes threshold value Vth1 of "0" data. If the potential of the channel is voltage VDDSA, the threshold value shifts only about 50 [%] from threshold voltage Vth0 of "1" data. That is, the threshold value of memory cell transistor MT dose not rise to the extent that the data is recognized as "0" data. Therefore, the operational reliability of the nonvolatile semiconductor memory can be improved.

(2) Area can be Reduced (Part 1)

With the nonvolatile semiconductor memory of the embodiment, MOS transistors 14 and 15 to which voltage VDDSA and voltage VDD transferred from VDDSA generator circuit 9 and VDD generator circuit 10 are input, respectively, are formed on the same well, which reduces the area. As described above, this is achieved by providing detection circuit 7 and short circuit 8 controlled by the detection circuit 7.

Specifically, even if voltage VDDSA<voltage VDD, since detection circuit 7 short-circuits short circuit 8, there is no need to separate n-well region 33 into n-well region 33 where MOS transistor 14 is to be formed and n-well region 33 where MOS transistor 15 is to be formed. That is, there is no need to assume a case where the expression voltage VDDSA<voltage VDD is satisfied due to an external influence. Specifically, in the case of voltage VDDSA<voltage VDD, it is neither necessary to assume the forward bias between n-type semiconductor substrate 30 and impurity diffused layer 32 nor necessary to separate n-well region 33 more than a specific distance apart. As a result, the area required to separate n-well regions 33 more than a specific interval apart can be reduced. Since MOS transistors 14 and 15 are formed at the terminals to which voltage VDDSA or voltage VDD is input, the area is reduced by the extent corresponding to the number of sense amplifiers 4 formed. Accordingly, the circuit area can be reduced and therefore the operational reliability can be improved without erroneous operations.

In addition, voltage VDDSA is generated by VDDSA generator circuit 9 in a write operation. Voltage VDD generated by VDD generator circuit 10 is used as the internal voltages and read voltage other than voltage VDDSA. That is, VDD generator circuit 10 can be used for more than one purpose, enabling a cost reduction.

Furthermore, the output end of VDDSA generator circuit 9 is short-circuited with the output terminal of VDD generator circuit 10 by short circuit 8 unless VDDSA generator circuit 9 generates voltage VDDSA. That is, VDDSA generator circuit 9 outputs voltage VDD except when VDDSA generator circuit 9, being supplied with external voltage Vext2, generates voltage VDDSA. Specifically, in the embodiment, although VDDSA generator circuit 9 is provided to prevent program disturbance, use of VDDSA generator circuit 9 does not require any modification of the system. In other words, the effect of the embodiment can be obtained simply by providing VDDSA generator circuit 9 in the existing product as needed.

(3) Voltage VDDSA can be Switched to Voltage VDD Quickly (Part 1)

With the nonvolatile semiconductor memory of the embodiment, the control unit (not shown) controls signal disc1 and signal disc2 as explained in FIG. 8, thereby controlling the potentials at nodes N16, N19, and N11. When an attempt is made to consume the voltage corresponding to (voltage VDDSA−voltage VDD) only with resistive element 58 without providing resistive element 59 or MOS transistor 60, it will take a lot of time to transit to voltage VDD. This causes a delay in the operation of the entire nonvolatile semiconductor memory. Specifically, this delay is caused by the transition from a write operation to a verify operation to check whether the writing is performed properly (hereinafter, referred to as a write-verify operation). For example, the transition from a write operation to a write-verify operation and the transition from an erase operation to an erase-verify operation (hereinafter, referred to as an erase-verify operation) are carried as many times as necessary. Therefore, even if the delay is short, the total delay time of the entire nonvolatile semiconductor memory becomes very long.

In this respect, the nonvolatile semiconductor memory of the embodiment has resistive element 59 and MOS transistor 60. Specifically, MOS transistor 60 is turned on, thereby connecting resistive elements 58 and 59 in parallel, which decreases a combined resistance of resistive elements 58 and 59. This causes the current flowing through resistive elements 58 and 59 to increase, which increases the power consumption in resistive elements 58 and 59. As a result, voltage VDDSA at node N11 can be switched to voltage VDD' quickly.

This is because not only MOS transistor 60 but also MOS transistor 56 is subjected to on/off control. That is, when the potential at node N11 is dropped, MOS transistor 56 is turned on and the potentials at nodes N16, N19 are transited from voltage $V1_{VDDSA}$ to 0 [V]. This causes 0 [V] to be applied to the gate of MOS transistor 57 and MOS transistor to be turned off. That is, external voltage Vext at node N10 is not transferred to node N11. The voltage the resistive elements 58, 59 have to consume is the potential at node N11 to which an external voltage is not transferred. This makes it possible to cause the potential at node N11 to transit quickly to voltage VDD'. When voltage VDD' is raised to voltage VDD, signal disc1 is made low, preventing the potentials at nodes N16, N19, and N11 from dropping. At this time, since the resistance value of step-up resistance unit 54 is R2, the potential at node N11 can be transited to voltage VDD.

<First Modification>

Figure 14:
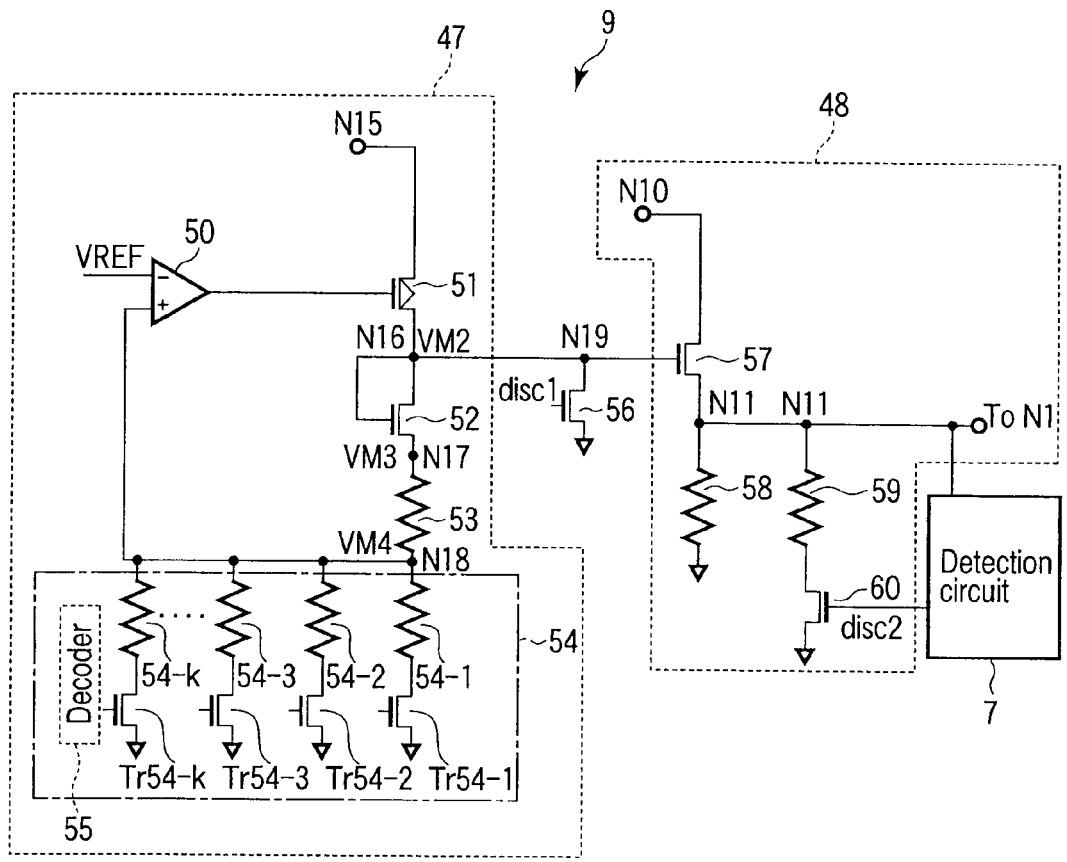
FIG. 14 is a circuit diagram of a VDDSA generator circuit and a detection circuit according to a modification of the embodiment.

Next, a VDDSA generator circuit 9 according to a first modification of the embodiment will be explained. FIG. 14 shows a VDDSA generator circuit 9 according to the modification. FIG. 14 is a circuit diagram showing a detection circuit 7 as used in FIG. 8. As shown in FIG. 14, MOS transistor 60 may be controlled by detection circuit 7 according to the potential at node N11.

<Operation of Detection Circuit 7>

Figure 15:
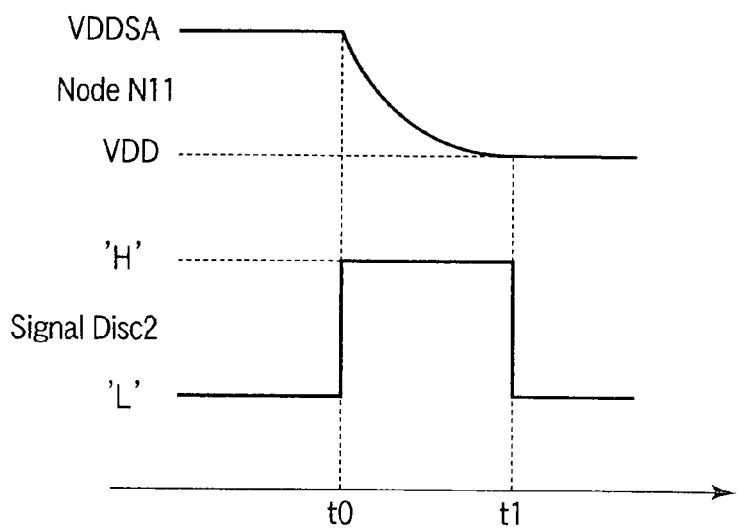
FIG. 15 is a timing chart to explain a voltage transfer operation according to the modification of the embodiment, showing N11 and signal disc2.

Next, the operation of detection circuit 7 will be explained with reference to FIG. 15. FIG. 15 is a timing chart to explain signal disc2 output to the gate of MOS transistor 60 by detection circuit 7 and the potential at node N11. Let the potential at node N11 at time t0 be voltage VDDSA and the potential at node N11 at time t1 be voltage VDD.

Detection circuit 7 detects the potential at node N11. Since the potential at node N11 is voltage VDDSA at time t0, detection circuit 7 outputs a high level signal as signal disc2 to lower the potential at node N11. This turns on MOS transistor 60, causing resistive elements 58, 59 to form a parallel circuit. Accordingly, the potential at node N11 drops from voltage VDDSA and reaches voltage VDD at time t1. Detecting this, detection circuit 7 outputs a low-level signal disc2 to the gate of MOS transistor 60. This turns off MOS transistor 60, making the other end of resistive element 59 floating, which stops the discharge of node N11.

<Effect of First Modification>

The nonvolatile semiconductor memory according to the first modification produces not only the effects in item 1 to item 3 but also the effect below.

(4) Voltage VDDSA can be Switched to Voltage VDD Quickly (Part 2)

In the nonvolatile semiconductor memory of the first modification, detection circuit 7 monitors the potential at node N11 and, when voltage VDDSA is dropped to voltage VDD, supplies a low-level signal disc2 to the gate of MOS transistor 60, thereby preventing a voltage lower than voltage VDD from discharging. That is, it is not that voltage VDDSA is dropped to voltage VDD' once and then raised to voltage VDD as in the embodiment, but that the MOS transistor is stopped from discharging at the time VDDSA is dropped and reaches voltage VDD. This makes it possible to cause voltage VDDSA to transit to a desired voltage quickly and therefore improve the operation speed of the nonvolatile semiconductor memory.

<Second Modification>

Next, a nonvolatile semiconductor memory according to a second modification of the embodiment will be explained. The second modification is such that the detection circuit 7 and short circuit 8 are eliminated in FIG. 1 and a step-down circuit 70 is provided. FIG. 16 is a block diagram of the second modification. As shown in FIG. 16, the step-down circuit 70 is connected to node N2 and node N3.

Next, the step-down circuit will be explained in detail with reference to FIG. 17. FIG. 17 is a circuit diagram of the step-down circuit 70. As shown in FIG. 17, the step-down circuit 70 is so configured that the step-up resistance unit 54, MOS transistors 56, 60, and resistive elements 58, 59 are eliminated in VDDSA generator circuit 9 of FIG. 8 and resistive element 71, MOS transistors 72 to 74, and capacitor element 79 are provided and further node N15 and node N10 are connected. Hereinafter, explanation of the same configuration as that of FIG. 8 will be omitted.

As shown in FIG. 17, one end of resistive element 71 is connected to the other end of resistive element 53 at node N18. The other end of resistive element 71 is connected to one end of the current path of MOS transistor 72. The other end of the current path of MOS transistor 72 is grounded. That is, comparator 50 compares potential VM2 at node N18 with reference voltage VREF. Depending on the result of the comparison, comparator 50 turns on or off MOS transistor 50. The value obtained by adding threshold value Vt of MOS transistor 51 to the voltage applied to the gate of MOS transistor 51 is determined to be the voltage at node N16. Let this potential be voltage VM1 as described above. When voltage VDD is applied to the gate of MOS transistor 51, node N16 is charged to voltage (VDD+Vt).

One end of the current path of MOS transistor 57 is connected to node N2 to which voltage VDDSA is applied. The other end of the current path is connected to node N3 to which voltage VDD is applied. The gate of MOS transistor 57 is connected to node N16. If the threshold value of MOS transistor 57 is Vt, node N3 is charged at voltage VDDSA applied to node N2 to voltage VDD.

One end of the current path of MOS transistor 74 is connected to node N3. The other end of the current path is connected to node N5. Signal S1 is supplied to the gate of MOS transistor 74. One end of the current path of MOS transistor 73 is connected to node N2. The other end of the current path is connected to node N4. Signal S2 is supplied to the gate of MOS transistor 73. A capacitor element 75 serving as line-to-line capacitance C is formed between lines to which MOS transistors 73, 74 are connected respectively. That is, one electrode of the capacitor element is connected to node N4 and the other electrode is connected to node N5.

<Operation of Step-Down Circuit 70>

Next, the operation of step-down circuit 70 will be explained with reference to FIG. 18. FIG. 18 is a timing chart to explain the potentials at nodes N2 to N5 and the potentials of the channel of MOS transistor 57. Each of signals S1, S2 is constantly made high. That is, both of MOS transistors 73, 74 are turned on. MOS transistor 57 is also turned on.

As shown in FIG. 18, at time t0, voltage VDD applied to node N3 starts to rise. This is because the output voltage of VDD generator circuit 10 drops as a result of charging to the voltage necessary for bit line BL connected via node N3 and sense amplifier 4.

Moreover, voltage VDD output from VDDSA generator circuit 9 is switched to a write preparation operation to output voltage VDDSA at time t0. This causes the potentials at nodes N2, N4 to start to rise at time t0. Also at time t0, the potential of the channel of MOS transistor 57 starts to rise from voltage VDD.

At time t1, node N5 is charged gradually and the potential on line 2 connected to node N5 starts to rise. Accordingly, a coupling phenomenon takes place according to the line-to-line capacitance C between line 1 connected to node N4 and line 2 connected to node N5. Specifically, a rise in the voltage on line 2 results in a rise in the potential on line 1. That is, because of coupling, the potential at node N4 rises at time t2. Let the voltage risen by coupling be voltage Vc.

Then, the voltage risen at node N4 by coupling flows back to node N2. That is, at time t3, the voltage at node N2 risen from voltage VDD is higher by the voltage risen through coupling. Then, at time t4, the potential at node N5 reaches voltage VDD. At time t5, the potential at node N4 is higher by voltage Vc than at time t2. Then, at time t6, the potential of the channel to start to rise as much as equals the voltage risen by coupling. That is, since MOS transistor 57 is on, the voltage risen by coupling does not flow back to VDDSA generator circuit 9 and is applied to node N3 via MOS transistor 57.

Then, at time t7, the potential at node N2 is higher than at time t3 by voltage Vc. As a result, at time t8, the potential of the channel is higher than at time t6 by voltage Vc. Then, voltage Vc is transferred to node N3. That is, at time t8, the potential at node N3 starts to rise. Therefore, use of line-to-line capacitance C compensates for a drop in the voltage at node N3. While in FIG. 18, the timing chart for various nodes in the case of voltage VDDSA>voltage VDD has been shown, a timing chart in the case of voltage VDDSA<voltage VDD may be used. In this case, too, use of the coupling phenomenon compensates for a drop in voltage VDDSA.

<Effect of Second Modification>

The nonvolatile semiconductor memory according to the second modification produces not only the effects in item 1 to item 3 but also the effect below.

(5) Operational Stability can be Improved

In the nonvolatile semiconductor memory according to the second modification, use of the step-down circuit 70 makes it possible to prevent voltage Vc at node N4 risen by coupling from flowing back to VDDSA generator circuit 9 via node N2. Moreover, the dropped voltage VDD can be compensated for with voltage Vc generated by coupling. This makes it possible to supply stable voltage VDD to node N5.

This results from providing MOS transistor 57 connected to node N2 and node N3. That is, voltage VM2 applied to the gate of MOS transistor 57 is at voltage (VDD+Vt). Since the threshold value of MOS transistor 57 is also Vt, the maximum transfer voltage of MOS transistor 57 is voltage VDD. Accordingly, even if the voltage flowing back from node N4 to node N2 is not lower than voltage VDD, MOS transistor 57 transfers voltage VDD to node N3.

Therefore, the potential at node N3 will never become higher than voltage VDD, assuring a stable voltage.

(6) Area can be Reduced (Part 2)

In the nonvolatile semiconductor memory of the embodiment, use of the step-down circuit 70 enables the detection circuit 7 and short circuit 8 to be eliminated. This is because step-down circuit 70 can compensate for a drop in voltage VDDSA by making use of a coupling phenomenon even if voltage VDDSA<voltage VDD for some reason. Accordingly, even if voltage VDDSA<voltage VDD, nodes N2 and N3 need not be short-circuited and the voltage output from VDDSA generator circuit 9 need not be monitored.

As described above, with the nonvolatile semiconductor memory of the embodiment, if external voltage Vext2 is set at, for example, 3.0 [V], voltage VDDSA higher than voltage VDD can be generated. That is, if external voltage is at voltage Vext1, such as 1.8 [V], voltage VDDSA is not used. Even in this case, however, voltage generator circuit 3 may generate a voltage equivalent to external voltage Vext2 and supply Vext2 to VDDSA generator circuit 9. In this case, voltage VDDSA can be generated, regardless of the values of external voltages Vext1, Vext2.

Furthermore, memory cell transistor MT may be of the FG type. That is, in the case of the FG type, the stacked gate includes a charge storage layer (floating gate: conducting layer) formed above a semiconductor substrate via a gate insulating film and a control gate formed above the floating gate via an inter-gate insulating film. The embodiment is illustrative and not restrictive and may be modified variously. The first modification is not limited to the first and second embodiments. Similarly, the second modification is not limited to the first and second modifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a memory cell array which includes a plurality of memory cells, each including a charge storage layer and a control gate, being capable of holding not less than two levels of data, and having its current paths connected in series;
bit lines each of which is connected electrically to one end of the current path of the corresponding one of the memory cells;
a first voltage generator unit which is capable of supplying via a first output terminal to the bit lines a first voltage externally supplied or a third voltage which is obtained by stepping down a second voltage externally supplied and which is as high as the first voltage, the second voltage being higher than the first voltage; and
a second voltage generator unit which is capable of supplying a fourth voltage obtained by stepping down the second voltage to the bit lines via a second output terminal when the first voltage generator unit steps down the second voltage to generate the third voltage.

2. The memory according to claim 1, further comprising:
a first MOS transistor which has one end of its current path connected to the first output terminal and is capable of outputting the third voltage at the other end of its current path connected to the bit line;
a second MOS transistor which is formed on the same well as that of the first MOS transistor, has one end of its current path connected to the second output terminal, and is capable of outputting the fourth voltage at the other end of its current path connected to the bit line;
a short circuit which is capable of short-circuiting the first output terminal and the second output terminal; and
a detection circuit which monitors the fourth voltage and instructs the short circuit to short-circuit when the fourth voltage becomes lower than the third voltage.

3. The memory according to claim 1, wherein the second voltage generator unit includes:
a third voltage generator unit which generates a fifth voltage by stepping down the second voltage and outputs the fifth voltage to a first node,
a fourth voltage generator unit which generates the third voltage or the fourth voltage according to the fifth voltage and outputs either the third voltage or the fourth voltage to the second output terminal, and
a first switch element which discharges the fifth voltage at the first node,
the fourth voltage generator unit includes a first MOS transistor which has one end of its current path supplied with the second voltage, its gate supplied with the fifth voltage, and the other end of its current path connected to a second node connected to the second output terminal, a first resistive element which has one end of its current path connected to the second node and the other end of its current path grounded, a second resistive element which has one end of its current path connected to the second node, and a second switch element which is capable of connecting the other end of the current path of the second resistive element to the ground potential, wherein
the first switch element is turned on in a state where the fourth voltage is output at the second node, and the first node is grounded, turning off the first MOS transistor and turning on the second switch element, which drops the fourth voltage output from the second node to a sixth voltage lower than the third voltage, and then both the first switch element and the second switch element are turned off, causing the sixth voltage to transit to the third voltage.

4. The memory according to claim 1, further comprising:
a detection circuit which monitors the fourth voltage,
wherein the second voltage generator unit includes:
a third voltage generator unit which generates a fifth voltage by stepping down the second voltage and outputs the fifth voltage to the first node,
a fourth voltage generator unit which generates the third voltage or the fourth voltage according to the fifth voltage and outputs either the third voltage or the fourth voltage to the second output terminal, and
a first switch element which discharges the fifth voltage at the first node,
the fourth voltage generator unit includes a first MOS transistor which has one end of its current path supplied with the second voltage, its gate supplied with the fifth voltage, and the other end of its current path connected to a second node connected to the second output terminal, a first resistive element which has one end of its current path connected to the second node and the other end of its current path grounded, a second resistive element which has one end of its current path connected to the second node, and a second switch element which is capable of connecting the other end of the current path of the second resistive element to the ground potential, wherein
the detection circuit turns off the second switch element when having sensed which the second resistive element has been grounded and the potential at the second output terminal has transited from the fourth voltage to the third voltage in a state where the fourth voltage is output at the second node.

5. The memory according to claim 1, further comprising:
a transfer unit which transfers the voltage at the second output terminal to the first output terminal to keep the potential at the first output terminal at the third voltage; and
a control unit which performs control so as to enable the transfer unit to transfer the third voltage to the first output terminal, wherein,
the bit lines include first bit lines connected to the first output terminal and second bit lines connected to the second output terminal and adjacent to the first output terminal, and
the transfer unit transfers to the first output terminal the magnitude of potential on the second bit line raised as a result of a rise in the potential on the first bit line according to a line-to-line capacitance the first bit line and the second bit line have.

6. The memory according to claim 3, wherein the third voltage generator unit includes:
a second MOS transistor which has one end of its current path supplied with the second voltage and the other end of its current path connected to the first node,
a setting unit which is capable of setting the value of the fifth voltage at the first node, and
a control unit which controls the second MOS transistor so that the fifth voltage at the first node may coincide with the reference potential of the sense level at the first node, wherein
the value of the setting unit is changed to cause the fifth voltage to have a value corresponding to the third voltage or the fourth voltage.

7. The memory according to claim 6, wherein the setting unit includes:

a plurality of resistive elements one end of the current path of each of which is connected to the first node,
third switch elements which are capable of connecting the other ends of the current paths of said plurality of resistive elements to the ground potential separately, and
a decoder which turns on any one of the third switch elements.

8. A nonvolatile semiconductor memory comprising:
a memory cell array which includes a plurality of memory cells, each including a charge storage layer and a control gate, being capable of holding not less than two levels of data, and having its current paths connected in series;
bit lines each of which is connected electrically to one end of the current path of the corresponding one of the memory cells;
a first voltage generator unit which outputs a first voltage to a first output terminal on the basis of an external voltage supplied from the outside;
a second voltage generator unit which is configured to be capable of generating a second voltage different from the first voltage on the basis of the external voltage and outputs the second voltage to the second output terminal;
a sense amplifier which is capable of transferring the second voltage as a write inhibit voltage to the bit lines in a write operation; and
a data cache which is configured to be capable of holding data and is connected to the first voltage generator unit, the first voltage generator unit supplying the first voltage to the data cache.

9. The memory according to claim 8, further comprising:
a first MOS transistor which has one end of its current path connected to the first output terminal and is capable of outputting the first voltage at the other end of its current path connected to the bit line;
a second MOS transistor which is formed on the same well as that of the first MOS transistor, has one end of its current path connected to the second output terminal, and is capable of outputting the second voltage at the other end of its current path connected to the bit line;
a short circuit which is capable of short-circuiting the first output terminal and the second output terminal; and
a detection circuit which monitors the second voltage and instructs the short circuit to short-circuit when the second voltage becomes lower than the first voltage.

10. The memory according to claim 8, wherein the second voltage generator unit includes:
a third voltage generator unit which generates a third voltage by stepping down the external voltage and outputs the third voltage to a first node,
a fourth voltage generator unit which generates the first voltage or the second voltage according to the third voltage and outputs either the first voltage or the second voltage to the second output terminal, and
a first switch element which discharges the third voltage at the first node,
the fourth voltage generator unit includes a first MOS transistor which has one end of its current path supplied with the external voltage, its gate supplied with the third voltage, and the other end of its current path connected to a second node connected to the second output terminal, a first resistive element which has one end of its current path connected to the second node and the other end of its current path grounded, a second resistive element which has one end of its current path connected to the second node, and a second switch element which is capable of connecting the other end of the current path of the second resistive element to the ground potential, wherein
the first switch element is turned on in a state where the second voltage is output from the second node, and the first node is grounded, turning off the first MOS transistor and turning on the second switch element, which drops the second voltage output from the second node to a fourth voltage lower than the first voltage, and then both the first switch element and the second switch element are turned off, causing the fourth voltage to transit to the first voltage.

11. The memory according to claim 8, further comprising:
a detection circuit which monitors the fourth voltage,
wherein the second voltage generator unit includes:
a third voltage generator unit which generates a third voltage by stepping down the external voltage and outputs the third voltage to the first node,
a fourth voltage generator unit which generates the first voltage or the second voltage according to the third voltage and outputs either the first voltage or the second voltage to the second output terminal, and
a first switch element which discharges the third voltage at the first node,
the fourth voltage generator unit includes a first MOS transistor which has one end of its current path supplied with the external voltage, its gate supplied with the third voltage, and the other end of its current path connected to a second node connected to the second output terminal, a first resistive element which has one end of its current path connected to the second node and the other end of its current path grounded, a second resistive element which has one end of its current path connected to the second node, and a second switch element which is capable of connecting the other end of the current path of the second resistive element to the ground potential, wherein
the detection circuit turns off the second switch element when having sensed that the second resistive element has been grounded and the potential at the second output terminal has transited from the second voltage to the first voltage in a state where the second voltage is output at the second node.

12. The memory according to claim 8, further comprising:
a transfer unit which transfers the voltage at the second output terminal to the first output terminal to keep the potential at the first output terminal at the first voltage; and
a control unit which performs control so as to enable the transfer unit to transfer the first voltage to the first output terminal, wherein,
the bit lines include first bit lines connected to the first output terminal and second bit lines connected to the second output terminal and adjacent to the first output terminal, and
the transfer unit transfers to the first output terminal the magnitude of potential on the first bit line raised as a result of a rise in the potential on the second bit line according to a line-to-line capacitance the first bit line and the second bit line have.

13. The memory according to claim 10, wherein the third voltage generator unit includes:
a second MOS transistor which has one end of its current path supplied with the external voltage and the other end of its current path connected to the first node,
a setting unit which is capable of setting the value of the third voltage at the first node, and a control unit which controls the second MOS transistor so that the third voltage at the first node may coincide with the reference potential of the sense level at the first node, wherein the value of the setting unit is changed to cause the third voltage to have a value corresponding to the first voltage or the second voltage.

14. The memory according to claim 13, wherein the setting unit includes:

a plurality of resistive elements one end of the current path of each of which is connected to the first node, third switch elements which are capable of connecting the other ends of the current paths of said plurality of resistive elements to the ground potential separately, and a decoder which turns on any one of the third switch elements.

15. A nonvolatile semiconductor memory comprising:

a memory cell array which includes a plurality of memory cells, each including a charge storage layer and a control gate, being capable of holding not less than two levels of data, and having its current paths connected in series;

bit lines each of which is connected electrically to one end of the current path of the corresponding one of the memory cells;

a first voltage generator unit which outputs a first voltage to a first output terminal on the basis of an external voltage supplied from the outside;

a second voltage generator unit which is configured to be capable of generating a second voltage different from the first voltage on the basis of the external voltage and outputs the second voltage to the second output terminal; and a sense amplifier which includes a first latch circuit which is capable of holding data in writing or reading data into or from the memory cells and of operating on the first voltage and a second latch circuit which is capable of operating on the second voltage.

16. The memory according to claim 15, further comprising:

a first MOS transistor which has one end of its current path connected to the first output terminal and is capable of outputting the first voltage at the other end of its current path connected to the bit line;

a second MOS transistor which is formed on the same well as that of the first MOS transistor, has one end of its current path connected to the second output terminal, and is capable of outputting the second voltage at the other end of its current path connected to the bit line;

a short circuit which is capable of short-circuiting the first output terminal and the second output terminal; and a detection circuit which monitors the second voltage and instructs the short circuit to short-circuit when the second voltage becomes lower than the first voltage.

17. The memory according to claim 15, wherein the second voltage generator unit includes:

a third voltage generator unit which generates a third voltage by stepping down the external voltage and outputs the third voltage to a first node, a fourth voltage generator unit which generates the first voltage or the second voltage according to the third voltage and outputs either the first voltage or the second voltage to the second output terminal, and a first switch element which discharges the third voltage at the first node, the fourth voltage generator unit includes a first MOS transistor which has one end of its current path supplied with the external voltage, its gate supplied with the third voltage, and the other end of its current path connected to a second node connected to the second output terminal, a first resistive element which has one end of its current path connected to the second node and the other end of its current path grounded, a second resistive element which has one end of its current path connected to the second node, and a second switch element which is capable of connecting the other end of the current path of the second resistive element to the ground potential, wherein the first switch element is turned on in a state where the second voltage is output from the second node, and the first node is grounded, turning off the first MOS transistor and turning on the second switch element, which drops the second voltage output from the second node to a fourth voltage lower than the first voltage, and then both the first switch element and the second switch element are turned off, causing the fourth voltage to transit to the first voltage.

18. The memory according to claim 15, further comprising:

a detection circuit which monitors the second voltage, wherein the second voltage generator unit includes:

a third voltage generator unit which generates a third voltage by stepping down the external voltage and outputs the third voltage to the first node, a fourth voltage generator unit which generates the first voltage or the second voltage according to the third voltage and outputs either the first voltage or the second voltage to the second output terminal, and a first switch element which discharges the third voltage at the first node, the fourth voltage generator unit includes a first MOS transistor which has one end of its current path supplied with the external voltage, its gate supplied with the third voltage, and the other end of its current path connected to a second node connected to the second output terminal, a first resistive element which has one end of its current path connected to the second node and the other end of its current path grounded, a second resistive element which has one end of its current path connected to the second node, and a second switch element which is capable of connecting the other end of the current path of the second resistive element to the ground potential, wherein the detection circuit turns off the second switch element when having sensed that the second resistive element has been grounded and the potential at the second output terminal has transited from the second voltage to the first voltage in a state where the second voltage is output at the second node.

19. The memory according to claim 15, further comprising:

a transfer unit which transfers the voltage at the second output terminal to the first output terminal to keep the potential at the first output terminal at the first voltage; and a control unit which performs control so as to enable the transfer unit to transfer the first voltage to the first output terminal, wherein, the bit lines include first bit lines connected to the first output terminal and second bit lines connected to the second output terminal and adjacent to the first output terminal, and the transfer unit transfers to the first output terminal the magnitude of potential on the first bit line raised as a result of a rise in the potential on the second bit line according to a line-to-line capacitance the first bit line and the second bit line have.

20. The memory according to claim 17, wherein the third voltage generator unit includes:

a second MOS transistor which has one end of its current path supplied with the external voltage and the other end of its current path connected to the first node, a setting unit which is capable of setting the value of the third voltage at the first node, and a control unit which controls the third MOS transistor so that the third voltage at the first node may coincide with the reference potential of the sense level at the first node, wherein the value of the setting unit is changed to cause the third voltage to have a value corresponding to the first voltage or the second voltage.

* * * * *